United States Patent
Koike et al.

(10) Patent No.: US 7,163,739 B2
(45) Date of Patent: Jan. 16, 2007

(54) LAMINATE AND DISPLAY APPARATUS USING THE SAME

(75) Inventors: Katsuhiko Koike, Sodegaura (JP);
Tetsunori Shinozaki, Sodegaura (JP);
Tomoyuki Okamura, Sodegaura (JP);
Toshihisa Kitagawa, Sodegaura (JP);
Shin Fukuda, Sodegaura (JP); Hiroaki Saigou, Sodegaura (JP); Makoto Morohashi, Sodegaura (JP)

(73) Assignee: Mitsui Chemicals, Inc., Tokyo (JP)

( * ) Notice: Subject to any disclaimer, the term of this patent is extended or adjusted under 35 U.S.C. 154(b) by 0 days.

(21) Appl. No.: 10/276,247

(22) PCT Filed: Mar. 15, 2002

(86) PCT No.: PCT/JP02/02457

§ 371 (c)(1),
(2), (4) Date: Nov. 14, 2002

(87) PCT Pub. No.: WO02/074532

PCT Pub. Date: Sep. 26, 2002

(65) Prior Publication Data

US 2003/0176124 A1 Sep. 18, 2003

(30) Foreign Application Priority Data

| Mar. 15, 2001 | (JP) | ................................ 2001-74083 |
| Mar. 21, 2001 | (JP) | ................................ 2001-81399 |
| Apr. 13, 2001 | (JP) | ................................ 2001-115832 |
| Aug. 3, 2001 | (JP) | ................................ 2001-236440 |
| Oct. 22, 2001 | (JP) | ................................ 2001-323035 |

(51) Int. Cl.
*B32B 27/08* (2006.01)
*B32B 7/12* (2006.01)

(52) U.S. Cl. ................ 428/343; 428/354; 428/355 AC; 428/447

(58) Field of Classification Search ................ 428/354, 428/343, 355 AC, 447
See application file for complete search history.

(56) References Cited

U.S. PATENT DOCUMENTS (Continued)

FOREIGN PATENT DOCUMENTS

EP          0581610 A      2/1994

(Continued)

OTHER PUBLICATIONS

Machine translation of Jap. Patent Abstract Publication No. 09-019982, Jan. 21, 1997.*

(Continued)

Primary Examiner—Daniel Zirker
(74) Attorney, Agent, or Firm—Buchanan Ingersoll & Rooney PC

(57) ABSTRACT

A laminate is provided that can easily attain safety standards, such as impact resistance, while cost reduction is aimed for, for example, when the laminate is provided on a display viewing surface. A display apparatus using the laminate is also provided. By using a filter for a display having a specified parameter, for example, containing a transparent adhesive layer or a transparent resin layer having a specified Young's modulus and a specified thickness, impact resistance is enhanced. By using the filter for a display containing an impact absorption layer having a specified penetration and a specified thickness, impact resistance is enhanced.

13 Claims, 6 Drawing Sheets

U.S. PATENT DOCUMENTS

| | | | |
|---|---|---|---|
| 4,683,172 A | 7/1987 | LeGrand et al. | |
| 5,811,923 A | 9/1998 | Zieba et al. | |
| 6,444,311 B1 * | 9/2002 | Friedman et al. | 428/354 |
| 2002/0025441 A1 | 2/2002 | Hieda et al. | |

FOREIGN PATENT DOCUMENTS

| | | |
|---|---|---|
| EP | 0 799 693 A2 | 10/1997 |
| GB | 2334129 A | 8/1999 |
| JP | 1-188579 A | 7/1989 |
| JP | 1-279988 A | 11/1989 |
| JP | 7-287219 A | 10/1995 |
| JP | 8-192492 A | 7/1996 |
| JP | 8-220303 A | 8/1996 |
| JP | 8-220515 A | 8/1996 |
| JP | 9-19982 A | 1/1997 |
| JP | 9-243824 A | 9/1997 |
| JP | 10-65053 A | 3/1998 |
| JP | 11-174206 A | 7/1999 |
| JP | 2000-112393 A | 4/2000 |
| JP | A 2000-105311 | 4/2000 |
| JP | A 2001-266759 | 9/2001 |
| JP | A 2002-23649 | 1/2002 |
| JP | A 2002-260539 | 9/2002 |
| WO | WO 97/38855 A1 | 10/1997 |

OTHER PUBLICATIONS

Fujitsu Limited, Image Site, Catalog AD25-90004-2C, Japan, Apr. 1997.

Notification of Reason for Refusal dated Apr. 5, 2005 along with an English translation thereof, issued with regard to corresponding JP Patent Application No. 2002-573225.

Notice from Japanese Patent Office dated Apr. 12, 2005 along with an English translation thereof, issued with regard to corresponding Japanese patent Application No. 2004-43641 (a divisional application of JP Patent Application No. 2002-573225).

Notification of Reason for Refusal Mailed on Apr. 6, 2004 for Japanese Patent Application No. 2002-573225.

* cited by examiner

LAMINATE AND DISPLAY APPARATUS USING THE SAME

TECHNICAL FIELD

The present invention relates to a laminate capable of imparting functions such as mechanical strength enhancement, protection against breakage, shielding of electromagnetic waves, shielding of near-infrared rays, color tone change and the like, when the laminate is disposed on a display screen such as a plasma display (PDP), a cathode-ray tube (CRT), a liquid crystal display (LCD), an organic EL display (OELD), and a field emission display, and to a display apparatus using the laminate.

BACKGROUND ART

In recent years, with the rapid development of the society, a photoelectronic-related component and equipment have remarkably been progressed. Among other things, a display which represents an image has spread wide for use not only in a television set, but also in a monitor device for a computer and information terminal device. While in such spreading, a requirement for a larger size and a smaller thickness of the display, or for a smaller size and a lighter weight thereof for the purpose of a portable application is ever increasing in the market.

When an effort to increase the size of the display and, for the purpose of the portable application, downsize thereof is made, a safety problem comes up.

A viewing surface of the display is ordinarily made of a glass plate. As a surface area of the glass plate becomes larger, the glass plate becomes more liable to be subjected to external impact and, then, broken. Further, as an opportunity of taking the display out for carrying it outside is increased more, an opportunity for the display to be subjected to the external impact is increased more and the display becomes liable to be broken.

The safety for the display against the external impact is controlled, as described below, by Japan Electrical Appliance and Material Control Law.

For example, in regard to protection for a cathode-ray tube, an appliance provided with the cathode-ray tube in which a nominal size of a diameter of a maximum portion (in a case of a rectangular shape, length of a diagonal line) is more than 160 mm is controlled as follows: in a state in which the cathode-ray tube is appropriately fitted on a cabinet, when a steel ball having a diameter of 50 mm and a weight of 500 g is dropped from a height of 1,400 mm on a front surface of the cathode-ray tube in a manner of a swinging pendulum, the cathode-ray tube is required to comply with the following standards: (1) when a protective plate is made of bonded glass or a synthetic resin, fragments thereof will not be scattered in front; (2) when the protective plate is made of tempered glass, any abnormalities such as a crack, breakage and the like will not be generated; and (3) when the cathode-ray tube is not provided with the protective plate, fragments thereof will not be scattered in front.

In regard to mechanical strength of the cathode-ray tube, in an appliance provided with the cathode-ray tube in which a nominal size of a diameter of a largest portion (in case of a rectangular shape, a diagonal line length) is more than 160 mm, when the cathode-ray tube (in case of having a protective plate, inclusive of the protective plate) is broken by a mechanical method or a thermal shock method, weight of fragments of broken glass scattered in a space provided between barriers which are placed at a distance of 900 mm and at a distance of 1,500 mm respectively in front of the cathode-ray tube is 15 g or less for a single piece and 45 g or less for total fragments and, further, any piece having a weight of more than 1 g will not fly over the barrier placed at a distance of 1,500 mm in front of the cathode-ray tube.

A more specific method of application of mechanical strength can be found, for example, in UL (Underwriters Laboratories Inc.) specifications. Take, for example, a case of drop test. In this test, a display element is dropped on a plate from a height of 750 mm. The plate is made of hardwood and has a thickness of 20 mm. Two plates each having a thickness of 20 mm are folded with each other and, then, the resultant laminated plate is placed on concrete and, thereafter, the plate is placed on the laminated plate.

As a display which can realize an enlargement of a size and also decrease in thickness, in addition to a conventional liquid crystal display (LCD), a plasma display panel (PDP) has recently attracted people's attention and is expected to be a large-sized display of the next generation.

As for the PDP, an optical filter is ordinarily provided on a viewing surface thereof. This optical filter is used for the purpose of shielding an electromagnetic wave and a near-infrared ray emitted from a PDP main body. Further, there are may cases in which the optical filter concurrently has a function to change a luminescent color into that having a favorable color tone.

The optical filter is prepared by imparting a transparent support which comprises a glass plate or a resin plate with a function. Since, in a conventional PDP, a transparent supporting substrate of the optical filter has a function as a front protective plate, the conventional PDP can easily attain safety standards defined by Japan Electrical Appliance and Material Control Law.

However, it is necessary to substantially decrease a production cost in order to allow the PDP to be popularized in the market. A cost reduction of the optical filter thereof is also required whereupon a material cost and a production cost by a sheet-feeding method of the transparent supporting substrate are items to be reviewed.

On the other hand, in the liquid crystal display (LCD), the viewing surface thereof is ordinarily provided with a polarizing plate, a phase difference plate, a film having an anti-reflection function and the like. Since these articles substantially have a function of protecting the display, the conventional LCD easily attains safety standards defined by Japan Electrical Appliance and Material Control Law.

Ordinarily the size of the screen of the LCD is up to 20 inches, but, since there is a rapidly expanding requirement in the market for a larger display, an effort for further enlargement of the LCD has been made. However, as the size of glass which becomes a substrate is larger, the glass is more liable to be broken whereupon it is difficult for a display having such a larger size of glass to satisfy the safety standards defined by Japan Electrical Appliance and Material Control Law by a conventional technique.

The LCD for the application of a small-sized portable terminal is expected to be frequently carried around whereupon there are many opportunities in which the LCD receives external impact, for example, by being dropped, hit or the like. In such opportunities, although the LCD has resistance against impact to a certain extent by the help of protective functions which are possessed by the polarizing plate and an anti-reflection-functional film provided on the viewing surface, such resistance is not sufficient. In fact, a majority of complaints which portable terminal manufacturers receive from portable terminal users are attributable to a phenomenon that the LCD is broken.

Also in regard to an organic EL display (OELD) and a field emission display (FED), as the sizes thereof become larger, glass substrates thereof are more liable to be broken in the same manner as in the LCD whereupon it also becomes difficult for these displays to comply with the safety standards defined by Japan Electrical Appliance and Material Control Law. Also for the application of the small-sized portable terminal, damage and breakage to be caused by the impact become a problem. Particularly in cases of OELD and FED, since these displays have neither the polarizing plate nor the phase difference plate which the LCD has, that is, have a smaller number of substantial protective members than the LCD whereupon these displays are more liable to be broken than the LCD.

It is an object of the invention to provide a laminate which can easily attain safety standards for, e.g., impact resistance and the like, for example, when the laminate is provided on a viewing surface of a display while aiming for a cost reduction, and a display apparatus using the laminate.

DISCLOSURE OF INVENTION

As a result of intensive studies conducted by the inventors of the invention in order to solve the problems, the inventors have found that a laminate in which a parameter determined by a specified impact test is in a specified range and, further, a laminate, comprising a transparent adhesive layer, a transparent resin layer and, optionally, an impact absorption layer, which satisfies at least one of the following requirements:

Young's modulus of the transparent adhesive layer is in a specified range;

Young's modulus of the transparent resin layer is in a specified range;

penetration of the impact absorption layer is in a specified range; and the transparent resin layer and/or the impact absorption layer comprises 2 or more layers in total and JIS-A hardness thereof satisfies a relation in a specified manner can solve the problem in the invention. The invention has been completed on the basis of this finding.

Namely, problems of the invention can be solved by inventions specified by aspects described below.

The invention relates to a laminate comprising at least a transparent adhesive layer and a transparent resin layer and having a thickness of 3.5 mm or less, wherein the following relation is satisfied:

$$T/F \geq 200$$

in which T (μs) represents a period of time during from generation of impact stress to an appearance of a first peak and F (kN) represents impact stress at the time of the first peak in a stress-time curve at a ball drop impact test in which a steel ball having a weight in a range of from 530 g to 550 g is dropped from a height of 10 cm.

The invention is characterized in that the laminate further comprises an impact absorption layer.

The invention relates to a laminate comprising one or more transparent adhesive layers and one or more transparent resin layers, wherein at least one of the following requirements is satisfied:

(I) Young's modulus and thickness of at least one of the one or more transparent adhesive layers are from $1 \times 10^2$ to $1 \times 10^6$ Pa and from 10 to 500 μm, respectively;

(II) Young's modulus and thickness of at least one of the one or more transparent resin layers are from $1 \times 10^3$ to $1 \times 10^8$ Pa and from 10 to 3,000 μm, respectively;

(III) the laminate comprises impact absorption layers, of which at least one has a penetration of from 50 to 200; and (IV) the laminate comprises at least two layers in total of the one or more transparent resin layers and/or impact absorption layers, of which two layers are in a relation that a ratio of JIS-A hardness therebetween is 1.1 or more.

The invention is characterized in that the one or more transparent adhesive layers comprise an acrylic resin or a silicone resin as a main component.

The invention is characterized in that the one or more transparent resin layers comprise at least one selected from a polyester resin, a polypropylene resin, an ethylene vinyl acetate copolymer, polyethylene, polystyrene, polyurethane, and an elastomer having transparency.

The invention is characterized in that the impact absorption layers comprise a silicone type gel.

The invention is characterized in that each of the one or more transparent resin layers and the impact absorption layers has a JIS-A hardness of from 0 to 98.

The invention is characterized in that at least one of the one or more transparent resin layers comprises a transparent electrically conductive layer or metallic mesh layer having a surface resistance of from 0.01 to 30 Ω/square.

The invention is characterized in that at least one of the one or more transparent resin layers has at least one function selected from an anti-reflection function, an anti-glare function, an anti-fouling function, an antistatic function, a polarizing function and phase difference forming function.

The invention is characterized in that the one or more transparent resin layers have a filtering function of filtering at least one region selected from whole region, near-infrared region and visible light region of electromagnetic waves.

The invention relates to a display apparatus comprising a display viewing surface having the above-mentioned laminate mounted thereon.

BRIEF DESCRIPTION OF DRAWINGS

Other and further objects, features, and advantages of the invention will be more explicit from the following detailed description taken with reference to the drawings wherein.

BEST MODE FOR CARRYING OUT THE INVENTION

Figure 1:
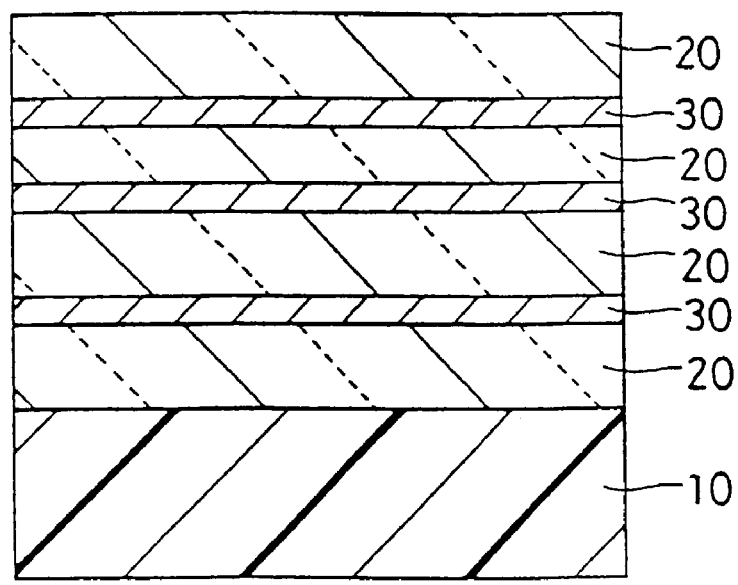
FIG. 1 is a cross-sectional view illustrating an example of a transparent electrically conductive film.

A laminate and a display apparatus using the laminate according to preferred embodiments of the invention will now be described with reference to accompanying drawings.

A first laminate according to the invention, comprising a transparent adhesive layer, a transparent resin layer and, optionally, an impact absorption layer, can be evaluated by a ball drop impact test in which a steel ball having a weight in a range of from 530 g to 550 g is dropped from a height of 10 cm. A filter for a display according to the invention satisfies the following relation between the time, T (μs), from a generation of impact stress to a first peak and impact stress, F (kN), at the time of the first peak in a stress-time curve obtained by the impact test:

$$T/F \geq 200$$

Such an evaluation is performed such that a compression type load cell (rated capacity: 20 kN; rated output: 1160*10$^{-6}$ strain) (LC-20KNG702; available from Nikkei Electronic Instruments Co., Ltd.) is fixed on a hard stable horizontal plane of a stone table or the like and, then, a sample film of a 5-cm square is fixed on a center portion of the load cell and, thereafter, a steel ball having a weight of from 530 g to 550 g is dropped on the sample film from a height of 10 cm at room temperature. On this occasion, stress and time are measured by using the load cell, a dynamic strain meter (AS2102; available from NEC San-ei Instruments, Ltd.), a high-speed DC amplifier (AP11-103; available from NEC San-ei Instruments, Ltd.) and a thermal dot recorder (RA1200; available from NEC San-ei Instruments, Ltd.) after they are connected with one another.

Although a decrease of the impact stress is ordinarily considered to be a large factor for increasing the impact resistance, a value of the "T/F" which takes into consideration not only the stress but also a generation time of the impact is an important parameter for evaluating the impact resistance.

Such an impact resistance parameter "T/F" value according to the invention is 200 or more, preferably 230 or more and more preferably 250 or more.

In a case in which the "T/F" value is less than 200, when the laminate is provided on a display member such as a PDP panel or the like to be described below, possibility of breakage of the member is increased whereupon the case is sometimes not favorable in actual use. Further, the laminate which satisfies these conditions has a remarkably high impact resistance and also complies with the Japan Electrical Appliance and Material Control Law and UL specifications.

A second laminate according to the invention, comprising a transparent adhesive layer, a transparent resin layer and, optionally, an impact absorption layer, satisfies at least one of the following requirements:

(I) Young's modulus and thickness of at least one layer of the transparent adhesive layer are from $1 \times 10^2$ Pa to $1 \times 10^6$ Pa and from 10 to 500 μm, respectively;

(II) Young's modulus and thickness of at least one layer of the transparent resin layer are from $1 \times 10^3$ Pa to $1 \times 10^8$ Pa and from 10 to 3,000 μm, respectively;

(III) penetration of at least one layer of the impact absorption layer is from 50 to 200; and (IV) the transparent resin layer and/or the impact absorption layer comprises 2 or more layers and a ratio of JIS-A hardness therebetween is 1.1 or more.

Respective layers of the first and second laminates according to the invention will now be described in detail.

(Transparent adhesive layer)

Young's modulus of a transparent adhesive layer is preferably from $1 \times 10^2$ to $1 \times 10^6$ Pa while thickness thereof is preferably from 10 to 500 μm.

Since the transparent adhesive layer has a low elasticity, when impact is added to a display element, the impact to glass of a viewing surface can be alleviated to prevent broken glass from being scattered.

In order for the transparent adhesive layer to absorb an external impact and prevent the impact from being transferred to the viewing surface, it is considered sufficient that the transparent adhesive layer changes the shape thereof in accordance with the external stress to alleviate and, accordingly, cancel the impact. For this reason, it is considered sufficient that elasticity of the transparent adhesive layer is allowed to be as low as possible.

Further, in order to prevent the broken glass from being scattered, it is considered sufficient that glass fragments does not exceed adhesive strength which is held against the transparent adhesive layer such that the glass will not fly out. For this reason, it is considered sufficient that the adhesive itself changes the shape thereof, absorbs impetus for flying out of the glass fragments and cancels the impetus. From this point, it is considered sufficient that the elasticity of the transparent adhesive layer is allowed to be as low as possible.

The elasticity of the transparent adhesive layer is preferably in a range of from $1 \times 10^2$ to $1 \times 10^6$ Pa, more preferably in a range of from $1 \times 10^2$ to $1 \times 10^5$ Pa and still more preferably in a range of from $1 \times 10^2$ to $1 \times 10^4$ Pa in terms of Young's modulus.

In a case in which the Young's modulus of the transparent adhesive layer is unduly large, that is, more than $1 \times 10^6$ Pa, when impact is added on the display element from a viewing surface side or mechanical strength is added on a whole display element, the impact can not fully be absorbed by the transparent adhesive layer whereupon the substrate glass of the viewing surface becomes liable to be broken or scattered.

On the other hand, in a case in which the Young's modulus of the transparent adhesive layer is unduly small, that is, less than $1 \times 10^2$ Pa, the transparent adhesive layer itself becomes liable to be broken whereupon it becomes difficult to prevent broken glass from being scattered.

It is preferable that the transparent adhesive layer according to the invention is as transparent as possible. The term "transparent" as used herein is intended to mean that, when the thickness thereof is 100 μm, luminous average transmittance of visible light is 50% or more.

Materials which are capable of being used as the transparent adhesive layer are not particularly limited, so long as the materials satisfy such conditions as described above. Specific examples thereof include rubber type adhesives, acrylic adhesives, silicone type adhesives, vinyl type adhesives and the like. Among these adhesives, since the acrylic adhesives and the silicone type adhesives use a material having a low elasticity as a starting material, they easily manufacture a layer having a low Young's modulus which characterizes the invention and, further, have a high transparency whereupon the acrylic adhesives and the silicone type adhesives are favorably used.

(Thickness of Transparent Adhesive Layer)

Thickness of a transparent adhesive layer according to the invention is preferably in a range of from 10 to 500 μm, more preferably in a range of from 50 to 500 μm and still more preferably in a range of from 100 to 500 μm. When the thickness is unduly large, that is, larger than 500 μm, transparency thereof is lost. When the thickness is unduly small, that is, less than 10 μm, a function to absorb the impact can not fully be exerted.

(Acrylic Adhesive)

Since an acrylic adhesive is low in price, it is widely used. Since the acrylic adhesive uses an acrylic polymer as a main starting material, the acrylic adhesive can be obtained by subjecting any one of monomers which are basic components to solution polymerization.

The solution polymerization is performed by ordinarily polymerizing an acrylic monomer in an organic solvent such as esters, aromatic hydrocarbons, or ketones using a peroxide or an azo type catalyst. The solvent, the concentration of the monomer composition and the like are determined depending on a final application or a performance to be required.

The acrylic adhesives are roughly divided into a non-cross-linking type and a cross-linking type.

The non-cross-linking type is a type which, after coated and dried, is used as it is and has thermoplasticity. For this reason, the non-cross-linking type is ordinarily deficient in an agglomeration property making itself difficult in obtaining elasticity.

In order to impart the agglomeration property thereby enhancing the elasticity, changes of types and quantities of copolymerization monomers and external additions of other polymers or resins such as a phenol resin and the like are conducted. By doing such conduct, it can be designed that a preferable agglomeration property, tackiness and adhesiveness are simultaneously imparted.

When the agglomeration property is imparted, depending on the copolymerization monomer rather than polymerization degree exhibits a remarkable effect. Specifically, an agglomeration component and a quality modification component are to be appropriately selected whereupon a balance therebetween is important. Ordinarily, as the agglomeration component, vinyl acetate is a favorable monomer, while, as the quality modification component, a monomer having a mono- or dicarboxylic acid is selected.

Further, as a type for imparting the agglomeration property, there is a cross-linking type. In the cross-linking type, the agglomeration property, tackiness and adhesiveness are well balanced thereamong by changing a cross-linking degree thereof.

An illustrative composition of the acrylic adhesive which has conventionally been used comprises vinyl acetate, octyl acrylate, ethyl acrylate and maleic anhydride.

On this occasion, components which influence the agglomeration property are vinyl acetate and ethyl acrylate. By decreasing ratios of contents of these components and, accordingly, decreasing the agglomeration property, the transparent adhesive layer having a low elasticity according to the invention can be obtained.

(Silicone Type Adhesives)

Since silicone type adhesives have a high thermal resistance, the silicone type adhesives are particularly favorably used in an application required for thermal resistance. Further, the silicone type adhesives are excellent in electrical characteristics, water resistance, moisture resistance and weather resistance, and as well they adheres well to an adherend having either a low surface energy or a high surface energy.

A composition of the silicone adhesives is based on silicone in a rubber state and silicone in a resin state.

Ordinarily, a dried film of the silicone type adhesive exhibits an adhesive property but has a low agglomeration property. For this reason, cross-linking is necessary and, by such cross-linking, the silicone type adhesives are adjusted to obtain an appropriate elasticity. On this occasion, the silicone type adhesives are heated ordinarily at 250° C. or, in cases where a peroxide such as benzoyl peroxide is added, heated at a temperature of from 150 to 170° C. for from 5 to 15 minutes.

An illustrative composition of the silicone type adhesives which has conventionally been adopted comprises (a) a methyl phenyl polysiloxane resin, (b) a phenyl vinyl siloxane resin, (c) dimethyl diphenyl cyclotetrasiloxane and (d) chloroplatinic acid.

On this occasion, the component which influences the agglomeration property, the cross-linking degree of other members and the elasticity of the transparent adhesive is (d) chloroplatinic acid. In order to obtain a targeted transparent adhesive having a low elasticity and according to the invention, it is sufficient that a content of (d) chloroplatinic acid is allowed to be lower than a conventional content.

(Form of Transparent Adhesive and Layer-Forming Method)

Forms of transparent adhesives are roughly divided into two categories, that is, a form in a sheet state and the other in a liquid state. The adhesive in a sheet state is ordinarily a pressure-sensitive type; on this occasion, after the adhesive is laminated to one of members to be bonded together, the other member is laminated to the member thus laminated with the adhesive whereupon two members are bonded together.

The adhesive in a liquid state is a type which is first subjected to application and bonding operations and, then, is hardened by being left to stand in room temperature or being heated; on this occasion, as application methods of the adhesive in a liquid state, mentioned are a bar coating method, a reverse coating method, a gravure coating method, a roll coating method and the like and, an appropriate method is selected from thereamong by taking into consideration a type, viscosity, a quantity to be applied and the like of the adhesive.

After a bonding operation is performed by using the transparent adhesive, in order to remove air entrapped at the time of the bonding operation, or to perform solution treatment on the adhesive and, further, to enhance adhesion strength between members, it is permissible that curing is performed under conditions of pressure and heating. On this occasion, the condition of pressure is ordinarily from about 0.001 to about 2 MPa and the condition of heating is, although depending on thermal resistance of individual members, from ordinarily about room temperature to about 80° C.

(Transparent Resin Layer)

Young's modulus in a direction perpendicular to a surface of a transparent resin layer which is characterized by elasticity and thickness according to the invention is preferably in a range of from $1\times10^3$ to $1\times10^8$ Pa and the thickness of the transparent resin layer is preferably in a range of from 10 to 3,000 μm.

The transparent resin layer which is characterized by the elasticity and thickness according to the invention has a function of preventing impact from being added to glass of a viewing surface when the impact is added to a display element or a function of preventing broken glass from being scattered whereupon the transparent resin layer plays an important role according to the invention.

The transparent resin layer according to the invention is used in forming a functional layer such as a transparent electrically conductive layer, an anti-reflection layer, an anti-glare layer or the like, or used after allowing a dye to be contained therein whereupon the transparent resin layer becomes a base of a laminate.

The transparent resin layer is required to be transparent. The term "transparent" as used herein is intended to mean that, when the thickness thereof is 100 µm, luminous average transmittance of visible light is 50% or more.

In order for the transparent resin layer to absorb an external impact and prevent the impact from being transferred, it is considered sufficient that the transparent resin layer changes the shape thereof by the external impact to alleviate and, accordingly, cancel the impact. In order to achieve these features, it is considered sufficient that the elasticity in a direction perpendicular to a surface of the transparent resin layer is controlled in correspondence with applications.

As the elasticity in a direction perpendicular to the surface of the transparent resin layer according to the invention, Young's modulus is preferably from $1\times10^3$ to $1\times10^8$ Pa, more preferably from $1\times10^3$ to $7\times10^7$ Pa and still more preferably from $1\times10^3$ Pa to $5\times10^7$ Pa.

In a case in which the Young's modulus of the transparent resin layer is unduly large, that is, more than $1\times10^8$ Pa, when impact is added on the display element from a viewing surface side or mechanical strength is added on a whole display element, the impact can not fully be absorbed in the transparent resin layer whereupon the substrate glass of the viewing surface becomes liable to be broken or scattered. While, in a case in which the Young's modulus of the transparent resin layer is unduly small, that is, less than $1\times10^3$ Pa, the transparent resin layer itself becomes liable to be broken; such a situation is not favorable.

A material which can be used in the transparent resin layer is not particularly limited so long as it satisfies the conditions described above. Specific examples of such materials include polyesters, polyethersulfone, polystyrene, polyethylene, polypropylene, a polyamide, a polyimide, a cellulose type resin, polyurethane, a fluorine type resin such as polytetrafluoroethylene or the like, a vinyl compound such as polyvinyl chloride or the like, polyacrylic acid, a polyacrylic ester, polyacrylonitrile, an addition polymer of a vinyl compound, polymethacrylic acid, a polymethacrylic ester, a vinylidene compound such as polyvinylidene chloride or the like, a copolymer of a vinyl compound or a fluorine type compound such as a vinylidene fluoride/trifluoroethylene copolymer, an ethylene/vinyl acetate copolymer or the like, a polyether such as polyethylene oxide or the like, an epoxy resin, polyvinyl alcohol, polyvinyl butyral, and, further, as transparent elastomers, for example, silicone rubber, urethane rubber, acrylic rubber, styrene-butadiene rubber, soft polyvinyl chloride, elastomers of ethylenic copolymers and the like such as an ethylene-propylene copolymer, ethylene-butene copolymer, an ethylene-vinyl acetate copolymer and the like, ethylenic transparent compositions such as a cross-linked product of a mixture of an ethylenic copolymer and an ethylene-propylene-diene copolymer and the like and thermoplastic elastomers such as a styrene type thermoplastic elastomer, a urethane type thermoplastic elastomer, and the like; however, materials which can be used in the transparent resin layer are not limited to these examples. Further, these materials may contain a filler such as silica or the like, oil as a plasticizer and an additive such as a heat resistant stabilizer, an anti-oxidant or the like so long as an original object of each of these materials will not be impaired. Furthermore, these materials may be subjected to a plasma treatment for the purpose of enhancing adhesiveness and the like.

Among these materials, a polyester resin, a polypropylene-resin or an ethylene vinyl acetate copolymer, polyethylene, polystyrene and polyurethane are favorably used.

Thickness of the transparent resin layer according to the invention is from 10 to 3,000 µm, preferably from 10 to 2,000 µm, more preferably from 10 to 1,500 µm, still more preferably from 10 to 1,000 µm and particularly preferably from 10 to 500 µm. When the thickness thereof is unduly small, that is, less than 10 µm, a sufficient impact absorbing capacity can not be obtained. On the other hand, when the thickness thereof is unduly large, that is, more than 3,000 µm, light transmittance sometimes becomes insufficient. Further, when a process is taken into consideration, in a case in which the thickness thereof is unduly small, at the time the transparent resin layer is utilized as an optical filter, it is difficult to provide the transparent resin layer on a display surface, while, in a case in which the thickness is unduly large, flexibility thereof is sometimes limited, although depending on a type of the material to be used.

The transparent resin layer having a thickness of from 50 to 250 µm is a so-called transparent polymer film and has flexibility whereupon a transparent electrically conductive film can continuously be formed by a roll-to-roll method; hence, a long transparent laminate having a large area can efficiently be produced. While, the transparent resin layer having a thickness of 250 µm or more is a so-called transparent polymer sheet whereupon an electrically conductive layer, an anti-reflection layer, anti-glare layer and the like can be formed by a sheet-feeding method. When elasticity thereof is low, the roll-to-roll method can also be adopted.

According to the invention, a surface of the transparent resin layer may previously be subjected to a sputtering treatment, a corona discharge treatment, a flame treatment, an etching treatment such as ultraviolet ray irradiation, electron beam irradiation or the like, and prime coating thereby improving adhesiveness of the transparent resin layer against a transparent electrically conductive layer to be formed thereon. Further, any desired inorganic material layer, for example, made of a given metal or the like may be formed between the transparent resin layer and the transparent electrically conductive layer. Furthermore, if necessary, a dust prevention treatment such as solvent cleaning, ultrasonic cleaning or the like may be performed, before a transparent electrically conductive film is formed.

Further, in order to enhance an anti-scratch property of the transparent laminate, a hard coat layer may be formed on at least one major surface of the transparent resin layer. Furthermore, when the laminate according to the invention has a plurality of transparent resin layers, at least one thereof is necessary to have the characteristics described above, but other layers are not limited by a parameter which influences the impact absorbing capacity.

(Impact Absorption Layer)

An impact absorption layer according to the invention is a layer in which, when an external force is applied on a screen of a display element provided with a laminate or an optical filter, the impact absorption layer alleviates the force whereupon the impact absorption layer prevents the display element from being broken.

(Impact Absorbing Capacity and Transparency)

It is necessary that an impact absorption layer has an appropriate impact absorbing capacity and transparency. The term "have an appropriate impact absorbing capacity" as used herein is intended to mean that a penetration value of the impact absorption layer is from 50 to 200, preferably from 80 to 200 and more preferably from 100 to 200, (based on JIS K2207-1991-50 g load). Further, the term "have transparency" as used herein is intended to mean that, when the thickness thereof is 100 μm, a value of luminous average transmittance is 40% or more.

When the thickness thereof is unduly small, the impact absorbing capacity can not fully be executed, while, when the thickness thereof is unduly large, light transmittance can not sufficiently be obtained; therefore, these cases are not favorable. For this reason, the thickness thereof is from 10 to 3,000 μm, preferably from 10 to 2,000 μm, more preferably from 10 to 1,500 μm, still more preferably from 10 to 1,000 μm and particularly preferably from 10 to 500 μm.

A material of the impact absorption layer is not particularly limited so long as the material satisfies conditions described above; on this occasion, examples of favorable materials include gels of such as silicone, polyethylene, polypropylene, polystyrene, polyurethane, acrylate and the like.

Among these gels, particularly silicone in a gel state can attain the impact absorption layer having favorable values of penetration and luminous average transmittance. Further, on this occasion, by sealing air in the gel, the impact absorbing capacity is enhanced and can more favorably be used.

When the impact absorption layer is fixed on the transparent resin layer, these layers are ordinarily bonded together by using an adhesive or the like. The adhesives or the like are not limited to any specific type so long as they have transparency. On this occasion, the term "have transparency" is intended to mean that, when the thickness thereof is 25 μm, luminous average transmittance is 50% or more. Further, as such adhesive, the transparent adhesive layer which is used for bonding the transparent resin layers themselves within a scope of constitution of the laminate according to the invention or an optical filter and a screen of a display element can be used as the adhesive. Details of the transparent adhesive layer are described below.

It is permissible to form the anti-reflection layer or the anti-glare layer in the impact absorption layer. Particularly in a case in which the laminate or the optical filter is provided on the display element and, as a result, the impact absorption layer is positioned on an outermost surface, in order to enhance visibility, it is preferable to form the anti-reflection layer or the anti-glare layer. Details of the anti-reflection layer and the anti-glare layer will be described below.

(Laminate)

A laminate according to the invention is constituted by laminating a transparent resin layer, a transparent adhesive layer and optionally an impact absorption layer; on this occasion, it is permissible that the impact absorption layer, the transparent resin layer and the transparent adhesive layer are each formed by one layer or are each present by a plurality of layers. When a plurality of impact absorption layers are present, an impact absorbing effect to be obtained is sometimes larger than that at the time the impact absorption layer is formed by one layer, from the standpoint of enhancement of the impact resistance.

On this occasion, when the transparent resin layer and/or the transparent adhesive layer are used by two layers or more in total (A layer, B layer), there are the following relations, in regard to JIS-A hardness (JIS-K6301 specifications) thereof, between JIS-A hardness (Ha) of the A layer and JIS-A hardness (Hb) of the B layer:

preferably Ha/Hb≧1.1;
more preferably Ha/Hb≧1.2; and
still more preferably Ha/Hb≧1.25.

Further, Ha and Hb values are each preferably from 0 to 98 and more preferably from 0 to 95.

As an evaluation method for hardness of a soft material, there is Shore-A hardness other than JIS-A hardness. In many cases, Shore-A hardness takes an approximately the same value as JIS-A hardness whereupon there is no practical problem in using Shore-A hardness values as Hc and Hd values.

A relation between positions of the A layer and B layer is discretional; however, it is preferable that the A layer is disposed at a side which is apt to be subjected to impact, for example, a side closer to a viewer at the time of being provided on the display apparatus.

It is preferable that a first laminate according to the invention satisfies at least one of the following requirements:

(I) Young's modulus and thickness of at least one layer of a transparent adhesive layer are from $1 \times 10^2$ to $1 \times 10^6$ Pa and from 10 to 500 μm, respectively;

(II) Young's modulus and thickness of at least one layer of the transparent resin layer are from $1 \times 10^3$ to $1 \times 10^8$ Pa and from 10 to 3,000 μm, respectively;

(III) penetration of at least one layer of an impact absorption layer is from 50 to 200; and (IV) the transparent resin layer and/or the impact absorption layer is two layers or more in total and a ratio of JIS-A hardness between any two layers is 1.1 or more.

(Display Element)

A laminate according to the invention can be used as a member of a display element. Examples of such display elements to be applicable include a plasma display panel (PDP), a liquid crystal display (LCD), an organic EL display (OELD), a field emission display (FED) and the like.

In a case of the PDP, the laminate can be used as an optical filter for the purpose of electromagnetic wave shielding or color adjustment. In a case of the LCD, the laminate can be used as a polarizing plate, a phase difference plate, an anti-reflection film and an anti-glare film. In cases of OELD and FED, the laminate can mainly be used as the anti-reflection film and the anti-glare film.

As a representative example, the optical filter for PDP will now be described.

(Optical Filter for PDP)

A PDP is ordinarily provided with an optical filter at its display front portion. Such provision is made due to the fact that a plasma display panel theoretically emits an intense electromagnetic wave and a near-infrared ray to outside an apparatus. The electromagnetic wave is known to give a detrimental effect on measuring instruments and it has recently been reported that there is also a possibility that the electromagnetic wave gives a detrimental effect on a human individual. For this reason, there is a trend in which the electromagnetic waves are controlled by law. For example, today in Japan, there are standards set by VCCI (Voluntary Control Council for Interference by data processing equipment electronic office machine), while, in the US, there are product standards set by FCC (Federal Communication Commission).

The near-infrared ray causes a malfunction to be generated in a cordless telephone, an infrared ray type remote controller or the like. Particularly problematic wavelength is from 800 to 1,000 nm. In order to suppress an emission of such electromagnetic wave and near-infrared ray, the optical filter has been used.

It is necessary that such optical filter is electrically conductive in a whole surface thereof and excellent in transparency. The optical filters which satisfy such requirements and are put to practical use are roughly divided into two types. One is a type which is called as a metal-mesh type in which a metallic mesh is disposed on a whole surface of a substrate in a fine lattice pattern manner. Although this type is excellent in electrical conductivity and electromagnetic wave shielding capacity, this type is inferior in near-infrared ray reflection capacity and transparency. The other one is a type which is called as a transparent film type in which a transparent electrically conductive thin film is disposed on a whole surface of the substrate. Although the optical filter of such a transparent electrically conductive thin film type is inferior in the electromagnetic wave shielding capacity to the metallic mesh type, the transparent electrically conductive thin film type is excellent in near-infrared ray shielding capacity and the transparency whereupon it can favorably be used as the filter for the display.

In many cases, the optical filter of the transparent electrically conductive thin film type is formed by bonding a transparent supporting substrate and the transparent electrically conductive thin film via the transparent adhesive. From the standpoint of an effort for a smaller weight and safety of the apparatus itself, although a transparent polymer molded body is favorably used as the transparent supporting substrate in many cases, since the transparent polymer molded body has a property of being deformed by being influenced by heat or moisture, glass is used in many cases. Further, there are also many cases in which the optical film having a function such as a reflection rate-lowering function, an anti-glare function or a color toning function is combined with the transparent electrically conductive film to be bonded together.

According to the invention, the optical filter which differs from these conventional ones and does not have the transparent supporting substrate is provided.

The electromagnetic wave shielding capacity of the optical filter becomes further excellent, as a surface resistance value of the optical filter becomes lower. In regard to the optical filter of the transparent electrically conductive thin film type, the transparent electrically conductive thin film can be obtained by laminating a metallic thin film layer having a low resistance. Among other things, a metallic thin film made of silver which has a lowest specific resistance among pure substances is favorably used. Further, for the purpose of increasing the transmittance and enhancing the safety of the metallic thin film layer, the metallic thin film layer is ordinarily sandwiched by transparent high refractive thin film layers to form a transparent electrically conductive thin film laminate.

In the optical filter for use in the electromagnetic wave shielding, conduction is to be obtained between the transparent electrically conductive thin film layer and an exterior part by using an external electrode.

A constitution of the optical filter according to the invention is not particularly specified so long as the optical filter can exhibit required functions.

A number of members constituting the optical filter is not particularly specified. Namely, all functions may be imparted to the transparent resin layer and the impact absorption layer or a plurality of layers having respective functions may be combined. When the function of the optical filter is formed in one layer of the transparent resin layer or the impact absorption layer, the transparent adhesive layer is used for bonding the optical filter on the viewing surface of the PDP. Further, when the optical filter is constituted by combining two or more of polymer films, the transparent adhesive is used for bonding the transparent adhesive layer for use in bonding the optional filter on the PDP viewing surface or bonding the respective polymer films together.

Specific examples of the constitutions of the optical filters are shown as follows.

A/B/H/E/I; A/B/H/E/C/F/I; A/B/E/H/C/F/I; A/B/H/E/C/F/D/G/I; A/B/E/H/C/F/D/G/I

In these examples, (A) represents a viewing surface of a PDP, (B), (C) and (D) each represent a transparent adhesive layer, (E), (F) and (G) represent a transparent resin layer and an impact absorption layer, (H) represents a transparent electrically conductive thin film and (I) represents an anti-reflection film.

Even when only one transparent adhesive layer is used, a sufficient effect can be expected, so long as thickness of the transparent adhesive layer is at or over a certain level; however, according to the invention, when the transparent adhesive layer which is characterized by a low elasticity is used for all of a plurality of the transparent adhesive layers, although thickness of each transparent adhesive layer is small, a sufficient effect in regard to the impact resistance can be obtained.

Even when only one transparent resin layer and the impact absorption layer are used, a sufficient effect can be expected, so long as thickness of thereof is at or over a certain level; however, according to the invention, when the transparent resin layer which is characterized by a low elasticity is used for all of a plurality of the transparent resin layers, although thickness of each transparent resin layer is small, a sufficient effect in regard to the impact resistance can be obtained.

The laminate according to the invention can be used as the optical filter for the PDP. On this occasion, there are many cases in which the transparent electrically conductive layer is formed in any one of the transparent resin layer and/or the impact absorption layer. The transparent electrically conductive layer according to the invention is such a transparent electrically conductive layer as comprising a mono-layer thin film or a multi-layer thin film. Further, according to the invention, the laminate in which the transparent electrically conductive layer is formed on a major surface of the polymer film is referred to as a transparent laminate. The polymer film can use a material having a Young's modulus of $1 \times 10^8$ or more other than the transparent resin layer described above. Preferable examples of such materials include a biaxially stretched polyethylene terephthalate film, a polybutylene terephthalate, bisphenol A polycarbonate, cellulose acetate and the like.

As the mono-layered transparent electrically conductive film, mentioned is the electrically conductive mesh, an electrically conductive film having a lattice type pattern, a metallic thin film or an oxide semiconductor thin film.

As the multi-layered transparent electrically conductive film, mentioned is a multi-layered thin film in which a metallic thin film and a high-refractive-index transparent thin film are laminated to each other. The multi-layered thin film in which the metallic thin film and the high refractive-index transparent thin film are laminated to each other has characteristics described below. Namely, a thin film of a metal such as silver not only has electric conductivity, but also has near-infrared ray reflection characteristics by a free electron of the metal. Further, the high-refractive-index transparent thin film has characteristics to prevent light reflection in a specified wavelength region in the metallic thin film. Therefore, such multi-layered thin films have favorable characteristics in any of the electric conductivity, near-infrared ray cutting-off capacity and visible light ray transmittance.

In order to obtain a filter for a display having both electromagnetic wave shielding capacity and near-infrared ray cutting-off capacity, a multi-layered thin film in which a metallic thin film having both high electric conductivity for absorbing the electromagnetic wave and a multiplicity of reflection interfaces for reflecting the near-infrared ray, and the high-refractive-index transparent thin film are laminated to each other is preferable.

While, according to the VCCI, Class A, which sets a regulated limit for industrial use, indicates that a radiation field intensity should be less than 50 dBμV/m, whereas Class B, which sets a regulated limit for domestic use, indicates that the radiation-field intensity should be less than 40 dBμV/m. However, in a frequency band extending from 20 MHz to 90 MHz, the radiation field intensity from the plasma display exceeds 40 dBμV/m in the plasma display having a diagonal size of about 20 inches and 50 dBμV/m in the plasma display having a diagonal size of about 40 inches. Thus, these types of plasma displays can not be put to domestic use as they are.

As a size of a screen and electric power consumption thereof become higher, the radiation field intensity of the plasma display becomes higher whereupon it is necessary to use an electromagnetic wave shielding material having high shielding effectiveness.

In order to obtain electromagnetic wave shielding capacity necessary for the plasma display as well as high visible light ray transmittance and low visible light ray reflectance, it is necessary that the transparent electrically conductive layer has electric conductivity of a low resistance such that a surface resistance thereof is from 0.1 to 30 Ω/square, more preferably from 0.1 to 15 Ω/square, and still more preferably from 0.01 to 5 Ω/square. The terms "visible light ray transmittance" and "visible light ray reflectance" as used herein are intended to include values calculated in accordance with JIS (R-3106) on the basis of the wavelength dependence of transmittance and reflectance.

Further, in order to shield an intense near-infrared ray emitted from the plasma display up to such a level as causes no problem in actual use, it is required to allow a light ray transmittance in a wavelength range of from 800 to 1,000 nm of the near-infrared ray in the filter for the display to be 20% or less and, further, in order to satisfy such a requirement, it is necessary that the transparent electrically conductive layer itself has a near-infrared ray cutting-off property from the reason that a number of constitutional members is required to be decreased and there is a limitation on a near-infrared ray absorption by using a dye. Reflection by the free electron of the metal can be utilized, in order to cut off the near-infrared ray in the transparent electrically conductive layer.

As the metallic thin film layer becomes thicker, the visible light ray transmittance becomes lower, while as the metallic thin film layer becomes thinner, the reflection of the near-infrared ray becomes weaker. However, by superimposing at least one layer of a laminate constitution in which the metallic thin film layer having a given thickness is interposed between the high-refractive-index transparent thin film layers, it is possible to enhance the visible light ray transmittance and, at the same time, increase a total thickness of the metallic thin film layer. Further, by controlling a number of layers and/or thickness of each layer, it is possible to allow the visible light ray transmittance, the visible light ray reflectance, the near-infrared ray transmittance, a transmitted color and a reflected color to be changed within a given range.

Ordinarily, as the visible light ray reflectance becomes higher, lighting equipment and the like are more mirrored in the screen whereupon effect to prevent the reflection on the surface of the representation portion is reduced thereby deteriorating visibility and contrast. Further, as the reflected color, an imperceptible color of, for example, white-, blue- or purple-base is preferable. Under these circumstances, as the transparent electrically conductive layer, a multi-layered lamination which is optically designed and controlled in an easy manner comes to be preferable.

In the optical filter for the PDP according to the invention, it is preferable to use the transparent laminate in which the transparent electrically conductive layer that is a multi-layered thin film is formed on one major surface of the polymer film.

A preferable transparent electrically conductive layer according to the invention is formed on one major surface of the polymer film by firstly laminating a repeating unit (a)/(b) comprising a high-refractive-index transparent thin film layer (a) and a metallic thin film layer (b) in order of precedence on the polymer film while repeating such repeating unit from tow times to four times and, then, further, laminating at least one high-refractive-index transparent thin film layer (a) on the resultant laminate and is characterized in that a surface resistance thereof is from 0.1 to 30 Ω/square. By these features, the transparent electrically conductive layer has properties excellent in low resistivity for electromagnetic wave shielding capacity, near-infrared ray cutting-off capacity, transparency, and visible light ray reflectance. Further, unless otherwise stated, the term "multi-layered thin film" as used herein is intended to include a transparent electrically conductive film of a multi-layered lamination in which at least one layer of a laminate constitution where a metallic thin film layer is interposed between the high-refractive-index transparent thin film layers is superimposed.

In the transparent electrically conductive layer according to the invention, the repeating unit is preferably laminated from two times to four times. That is, the transparent laminate according to the invention in which the transparent electrically conductive layer is laminated on one major surface of the polymer film (A) has a layer constitution of (A)/(a)/(b)/(a)/(b)/(a), (A)/(a)/(b)/(a)/(b)/(a)/(b)/(a) or (A)/(a)/(b)/(a)/(b)/(a)/(b)/(a)/(b)/(a). When the repeating unit is laminated more than 5 times, a restriction on a production apparatus and productivity becomes a serious problem, and, further, there is a tendency in which the visible light ray transmittance is deteriorated and the visible light ray reflectance is increased. On the other hand, when a repeating time is one time, it is impossible to simultaneously satisfy the low resistivity, the near-infrared ray cutting-off capacity and the visible light ray reflectance.

Further, the inventors have found that, in the multi-layered thin film in which the repeating unit is laminated from two times to four times, in order to allow the near-infrared ray cutting-off capacity, the visible light ray transmittance, and the visible light ray reflectance to be characteristics simultaneously advantageous to the plasma display, a surface resistance thereof is from 1 to 5 Ω/square.

Further, it is conceivable that an electromagnetic wave intensity to be emitted from the plasma display is lowered in the future. In such a case, it is anticipated that, even when the surface resistance of the optical filter is from 5 to 15 Ω/square, sufficient electromagnetic wave shielding characteristics can be obtained. It is also conceivable that the electromagnetic wave intensity to be emitted from the plasma display is further lowered. In such a case, it is also anticipated that, even when the surface resistance of the optical filter is from 15 to 30 Ω/square, sufficient electromagnetic wave shielding characteristics can be obtained.

As a material of the metallic thin film layer (b), silver is advantageous because it is excellent in electric conductivity, an infrared ray reflection property and visible light ray transmittance when it is laminated in multiple layers. However, silver lacks chemical and physical stability whereupon it tends to be deteriorated under actions of a contaminant, steam, heat, light and other factors present in the environment. Accordingly, an alloy composed of silver and at least one metal, having high environmental stability, for example, gold, platinum, palladium, copper, indium, tin or the like, or a metal which is stable to these environmental factors can favorably used. Particularly, gold and palladium are favorable because these metals are excellent in environmental resistance and optical characteristics.

Although no particular limitation is placed on a content of silver in such a silver-containing alloy, it is desirable that the electric conductivity and optical characteristics thereof do not differ substantially from those of the silver thin film; on this occasion, the content is in a range of from about 50% by weight or more to less than about 100% by weight. However, since an addition of another metal to silver ordinarily impairs an excellent electric conductivity and optical characteristics of silver, it is desirable that, when a plurality of metallic thin film layers are employed, if possible, at least one of the metallic thin film layers uses silver without allowing silver to be an alloy thereof, or only a metallic thin film layer on a first layer and/or an outermost layer as viewed from the substrate is allowed to be an alloy.

Thickness of the metallic thin film layer is determined by optical design and experiment, on the basis of electric conductivity, optical characteristics and the like, and is not particularly limited so long as the transparent electrically conductive layer has required characteristics. However, it is necessary, based on electric conductivity and the like, that a thin film is not of an island type structure, but in a continuous state whereupon the thickness thereof is preferably 4 nm or more. Further, when the metallic thin film layer is unduly thick, there occurs a problem in transparency; therefore, it is preferably 30 nm or less. When a multiple of the metallic thin film layers exist, all of such layers are not necessarily of the same thickness and do not necessarily comprise silver or an alloy thereof.

In order to form the metallic thin film layer, there may be employed any of conventionally known methods such as sputtering, ion plating, vacuum deposition, metal plating and the like.

No particular limitation is placed on the transparent thin film forming the high-refractive-index transparent thin film layer (a), so long as the transparent thin film has transparency in a visible region and have an effect of preventing light reflection in the visible region of the metallic thin film layer; however, a high-refractive-index material having such a high refractive index as being not less than 1.6, preferably not less than 1.8, and more preferably not less than 2.0 against a visible light ray is used. Specific examples of such materials which form such a transparent thin film include oxides of metals such as indium, titanium, zirconium, bismuth, tin, zinc, antimony, tantalum, cerium, neodymium, lanthanum, thorium, magnesium, gallium and the like; mixtures of these metal oxides; zinc sulfide; and the like.

In these oxides or the sulfide, the metal and an oxygen atom or a sulfur atom may be present in nonstoichiometric proportions; however, the oxides or the sulfide are permissible, so long as optical characteristics thereof are not substantially modified. Among the materials, zinc oxide, titanium oxide, indium oxide, and a mixture of indium oxide and tin oxide (ITO) are advantageously used because they not only have high transparency and a high refractive index, but also has a high-speed film formation, good adhesion to the metallic thin film layer and the like.

Thickness of the high-refractive-index transparent thin film layer can be determined by an optical design and an experiment, on the basis of the optical characteristics of the polymer film (hereinafter referred to also as "transparent substrate"), thickness and optical characteristics of the metal thin film layer, a refractive index of the transparent thin film layer, and the like; on this occasion, although no particular limitation is placed on the thickness thereof, it is preferably in a range of from 5 nm to 200 nm and more preferably from 10 nm to 100 nm. Further, when a plurality of high-refractive-index transparent thin film layers are present, all of the high-refractive-index transparent thin film layers are not necessarily in a same thickness and not necessarily made of a same transparent thin film material.

In order to form the high-refractive-index transparent thin film layer, there may be employed any of conventionally known methods such as sputtering, ion plating, ion beam assisted deposition, vacuum deposition, wet coating and the like.

In order to improve the environmental resistance of the transparent electrically conductive layer, any desired protective layer of an organic material or an inorganic material may be provided on a surface of the transparent electrically conductive layer to such an extent as does not remarkably detract from the electric conductivity and optical characteristics thereof. Further, in order to improve the environmental resistance of the metallic thin film layer, the adhesiveness between the metallic thin film layer and the high-refractive-index transparent thin film layer and the like, any desired inorganic material layer may be formed between the metallic thin film layer and the high-refractive-index transparent thin film layer to such an extent as does not detract from the electric conductivity and the optical characteristics thereof. Specific examples of these inorganic materials include copper, nickel, chromium, gold, platinum, zinc, zirconium, titanium, tungsten, tin, palladium and the like and, further, alloys composed of two or more of these metals. Thickness thereof is preferably in a range of from about 0.2 nm to about 2 nm.

In order to obtain a transparent electrically conductive layer having desired optical characteristics, a thin film material of each layer, a number of layers, film thickness of each layer and the like may be determined by performing an optical design which utilizes a vector method using optical constants (refractive index and extinction coefficient) of the polymer film and the thin film material, a method using an admittance diagram and the like while taking into consideration electric conductivity needed for the electromagnetic wave shielding capacity to be aimed for, that is, the metallic thin film material and its thickness. On this occasion, it is sufficient that an adjacent layer which is formed on the transparent electrically conductive layer is taken into consideration. This is attributable to the fact that, since an entrance medium for light entering the transparent electrically conductive layer formed on the polymer film is different from an entrance medium having a refractive index of 1 such as air, vacuum or the like, a transmitted light color (as well as transmittance, reflected light color and reflectance) undergoes changes. Namely, in a case in which the transparent adhesive layer is interposed when the functional transparent layer is formed on the transparent electrically conductive layer, designing is performed while taking into consideration an optical constant of the transparent adhesive layer. Further, when the functional transparent layer is disposed directly on the transparent electrically conductive layer, designing is performed while taking into consideration the optical constant of a material which contacts the transparent electrically conductive layer.

By designing the transparent electrically conductive layer in such a manner as described above, when a bottom layer and a top layer as viewed from the polymer film are thinner than any other layer interposed therebetween in the high-refractive-index transparent thin film layer (a), or a bottom layer as viewed from the polymer film is thinner than any other layer in the metallic thin film layer (b), and an adhesive which has a refractive index of from 1.45 to 1.65, a thickness of from 10 to 50 µm and an extinction coefficient of about 0 is an adjacent layer, reflectance of the transparent laminate is not significantly increased, that is, an increase of interfacial reflectance by forming the adjacent layer is 2% or less.

Particularly, in the transparent electrically conductive layer comprising repeating the repeating unit 3 times, that is, 7 layers, when a second metallic thin film layer in the midst of the metallic thin film layer (b) comprising three layers, that is, a fourth layer as viewed from the polymer film, is thicker than any other layer, in a case in which the adhesive is the adjacent layer, reflectance of the transparent laminate is not significantly increased.

Further, the optical constant can be measured by using an ellipsometry (elliptically polarized light analytical method) or an Abbe refractometer and, further, film formation can be performed by controlling a number of layers, film thickness and the like while observing the optical characteristics.

The transparent electrically conductive layer of the filter for the display according to the invention is preferably also a metallic mesh layer.

In the mono-layered metallic mesh layer, a copper mesh layer is ordinarily formed on a polymer film. Ordinarily, a copper foil is first bonded on the polymer film and, then, the resultant copper foil-bonded polymer film is processed to be in a mesh state.

Both of flat-rolled copper and electrolytic copper are usable as the copper foil to be employed in the invention; however, porous metallic layer is preferably used and, on this occasion, a pore diameter thereof is preferably from 0.5 to 5 µm, more preferably from 0.5 to 3 µm, and still more preferably from 0.5 to 1 µm. When the pore diameter is larger than 5 µm, there is a fear of causing a problem in patterning, whereas, when the pore diameter is smaller than 0.5 µm, it is difficult to expect an enhancement of light ray transmittance. Further, porosity of the copper foil is in a range of preferably from 0.01 to 20%, more preferably from 0.02 to 15% and particularly favorably from 0.02 to 5%. The term "porosity" as used herein is intended to include a value specified by P/R, wherein R represents a volume; and P represents a pore volume. For example, provided that, when the pore volume of the copper foil against 0.1 cc of the volume thereof is measured by mercury porosity, the pore volume is 0.001 cc, the porosity can be defined as 1%. On this occasion, the copper foil to be used may be such a copper foil as has been subjected to any type of surface treatments. Specific examples of the surface treatments include chromate processing, surface roughening, pickling, zinc/chromate processing, and the like.

Thickness of the copper foil is preferably from 3 to 30 µm, more preferably from 5 to 20 µm, and still more preferably from 7 to 10 µm. When the thickness is more than this thickness, there occurs a problem that a prolonged time is required for etching, while, when the thickness is less than this thickness, there occurs a problem that electromagnetic wave shielding capacity is deteriorated.

An open area ratio of a light transmission part is from 60% to 95%, more preferably from 65% to 90%, and still more preferably from 70% to 85%. A shape of an open area portion is not particularly limited, but it is preferable that the shape thereof is in a form of an regular triangle, a regular tetragon, a regular hexagon, a circle, a rectangle, a rhombus, or the like, shapes of such open area portions are all alike and the open area portions are aligned within a surface thereof. As for a representative size of the open-area portion of the light transmission part, it is preferable that a side or a diameter thereof is in a range of, preferably from 5 to 200 µm, and more preferably from 10 to 150 µm. When the size is unduly large, namely, more than 200 µm, the electromagnetic wave shielding capacity is deteriorated, while, when the size is unduly small, namely, less than 5 µm, an unfavorable influence will be given to an image on a display. Further, it is preferable that width of a metal in other portions than the open area portions is preferably from 5 to 50 µm. Namely, a pitch is preferably from 10 to 250 µm. When the pitch is smaller than such a width, namely less than 10 µm, working becomes extremely difficult. On the other hand, when the pitch is larger than such width, namely, the pitch is larger than 50 µm, an unfavorable influence will be given to the image.

A substantial sheet resistance of a metallic layer having the light transmission part, as used herein, is a sheet resistance measured by a 4-terminal method having an interval between electrodes at least 5 times as large as the repeating unit of the pattern by utilizing an electrode at least 5 times as large as the pattern. For example, when the open area portion has a shape of a regular tetragon having a side of 100 µm, and are regularly aligned, while the metallic layer is 20 µm wide, measurements can be conducted by disposing electrodes each having a diameter of 1 mm with an interval of 1 mm therebetween. Alternatively, a pattern-bearing film is processed to be in strip form and, then, electrodes are disposed at both ends thereof in a longitudinal direction and, thereafter, resistance (R) thereof is measured to obtain the expression: the substantial sheet resistance=R×b/a, wherein a represents length in a longitudinal direction; and b represents length in a transverse direction. A value obtained in such a manner as described above is preferably from 0.01 Ω/square to 0.5 Ω/square, and more preferably from 0.05 Ω/square to 0.3 Ω/square. When a value which is smaller than 0.01 Ω/square is tried to obtain, the film becomes unduly thick thereby being unable to sufficiently obtain the opening area portion, while, when a value becomes larger than 0.5 Ω/square, sufficient electromagnetic wave shielding capacity can not be obtained.

As for a method of laminating a copper foil on a polymer film, a transparent adhesive is used. Examples of such adhesives include those of acrylic type, epoxy type, urethane type, silicone type, polyester type and the like; however, adhesives are not particularly limited to these types. A two-component type and a thermosetting type are favorably used. Further, it is preferable that the adhesive is excellent in chemical resistance. It is permissible that, after the adhesive is applied to the polymer film, the copper foil can be bonded to the resultant adhesive-applied polymer film, or the copper foil is applied with the adhesive and then bonded.

As for a method of forming the light transmission part, a printing method or a photo-resist method can be used. In the printing method, it is of a common practice to allow a mask layer to form a pattern by a screen printing method utilizing a printing resist material. In a method of using a photo-resist material, the photo-resist material is solidly formed on a metallic foil by a roll coating method, a spin coating method, an entire-surface printing method, a transfer printing method, or the like and, then, is exposed to light and developed by using the photomask to perform resist patterning. After the resist patterning is completed, a metallic portion which will be an opening area portion is removed by a wet etching method whereby a metallic mesh having the light transmission part of a desired opening area shape and opening area ratio can be obtained.

(Toning)

Further, there are many cases in which an optical filter has a function to adjust a color emitted from a display to a favorable one. Also, there is a case in which the filter for the liquid crystal does not have a transparent electrically conductive layer and a main function thereof is a toning function.

When a transmitted color of the optical filter is rich in a tint of from yellowish green tint to green, contrast of the display is decreased and, further, color purity thereof is deteriorated and a white color representation sometimes becomes greenish. This phenomenon is attributable to the fact that light in a wavelength of around 550 nm which is a yellowish green color to green color is the highest in visibility.

When the visible light ray transmittance and the visible light ray reflectance in a multi-layered film are taken into serious consideration, the multi-layered thin film ordinarily inferior in a transmitted color tone. As the electromagnetic wave shielding capacity, that is, electric conductivity and near-infrared ray cutting-off capacity become larger, it becomes necessary to allow a total thickness of a metallic thin film to be larger. However, as the total thickness of the metallic thin film becomes larger, there is a tendency in which the transmitted color becomes more of from a green color to a yellowish green color. Therefore, it is required that, in the optical filter used for the plasma display, the transmitted color thereof is neutral gray or blue gray. This is attributable to a fact that contrast is deteriorated when green color transmission is intense, blue color luminescence is weak compared with red or green color luminescence, white color having a slightly higher color temperature than that of a standard white color is preferred, and the like. Further, it is desirable that, as the transmission characteristics of the optical filter, a chromaticity coordinate of white color representation on the plasma display is as near to a blackbody locus as possible.

When the multi-layered thin film is used in the transparent electrically conductive layer (B), it is important to allow the transmitted color of the optical filter to be neutral gray or blue gray by correcting a color tone of the multi-layered thin film. For performing such a correction of the color tone, it is sufficient that a dye having absorption in a visible wavelength region is used. For example, when an greenish tint exists in the transmitted color of the transparent electrically conductive layer (B), the correction to gray can be performed by using a dye of red color, while, when a yellowish tint exists in the transmitted color, the correction can be performed by using a dye of from blue to violet color.

In a color plasma display, a red color (R) luminescent phosphor such as $(Y, Gd, Eu) BO_3$ or the like, a green color (G) luminescent phosphor such as $(Zn, Mn)_2SiO_4$ or the like, and a blue color (B) luminescent phosphor such as $(Ba, Eu)MgAl_{10}O_{17}:Eu$ or the like which emit light by being excited by a vacuum ultraviolet light that is generated by direct or alternating electric current discharge in a rare gas are formed in display cells which constitute pixels. The phosphors are selected on a basis of color purity, a coating property to a discharge cell, a short period of residual luminescent time, luminous efficiency, thermal resistance and the like whereupon many of the phosphors now in practical use have yet to be improved in color purity thereof. Particularly, emission spectrum of the red color luminescent phosphor indicates several luminescent peaks over a wavelength range of from about 580 nm to about 700 nm. Since a luminescent peak in a side of a relatively intense short wavelength is luminescence of from yellow color to orange color, there occurs a problem in which color purity of red color luminescence is deteriorated thereby approaching to that of orange color luminescence. When a mixed gas of Xe and Ne is used as a rare gas, the color purity of the orange color luminescence brought about by radiative relaxation of an Ne-excited state is also deteriorated. As to green color luminescence and blue color luminescence, a position of a peak wavelength and broadness of luminescence are factors of deteriorating the color purity thereof.

Height of the color purity can be indicated, for example, in terms of an area of color reproduction gamut which is shown by an area of a triangle formed by connecting three vertices of R, G, B three colors in a coordinate system defined by Commission Internationale d'Eclairage (CIE) in which hue and saturation are represented by abscissa chromaticity x and ordinate chromaticity y, respectively. Due to a low color purity, the color reproduction gamut of luminescence of the plasma display is narrower than that which is shown by chromaticity of R, G and B colors defined by an NTSC (National Television System Committee) system.

Further, not only migration of luminescence between display cells, but also a state, in which luminescence of each color contains a broad range of unnecessary light thereby allowing necessary light to be obscure, becomes a factor of deteriorating color purity as well as contrast of the plasma display. Further, the contrast of the plasma display is ordinarily deteriorated under such a bright condition that external light emitted from lighting equipment such as a room light is present, as compared with dark condition. This is attributable to the fact that a substrate glass, a phosphor and the like reflect the external light whereupon unwanted light prevents necessary light from being conspicuous. A contrast ratio of the plasma display is from 100 to 200 under dark condition and from 10 to 30 under a bright condition of about 100lx of environmental luminance whereupon an improvement thereof becomes a target to be pursued. The fact that the contrast is low is also a factor of narrowing the color reproduction gamut.

In order to enhance the contrast, there is a method in which a neutral density (ND) filter is provided in front of the display thereby decreasing transmission over an entire visible wavelength region to reduce the reflection of the external light and the like at the substrate glass or the phosphor. However, in this method, when the visible light ray transmittance is extremely low, luminance and sharpness of the image are deteriorated whereupon no significant improvement on the color purity is noticed.

The inventors of the invention have found that enhancement of the color purity and contrast of the luminescent color of the color plasma display can be achieved by decreasing the unwanted luminescence and the reflection of the external light which cause to deteriorate the color purity and contrast of the luminescent color.

Further, the inventors have found that an application of a dye is capable of not only adjusting color of the optical filter to be neutral gray or neutral blue but also decreasing the unwanted luminescence and the reflection of the external light which cause to deteriorate the color purity and contrast of the luminescent color. The inventors have found that this is particularly conspicuous when the red color luminescence is near to orange and that the color purity of the red color luminescence can be improved by decreasing the luminescence in a wavelength of from 580 nm to 605 nm which causes such deterioration.

In the optical filter according to the invention, decrease of the unwanted luminescence and reflection of the external light can be conducted by allowing a dye having an absorption maximum in a wavelength of from 570 nm to 605 nm to be contained in the shielding body. On this occasion, it is necessary that transmission of light in a wavelength range of from 615 nm to 640 nm in which luminescence peak indicating a red color exists is not markedly impaired by a filter for display.

Ordinarily, a dye has a broad absorption range whereupon there is a risk in which even a dye having a desired absorption peak absorbs luminescence in a favorable wavelength as well by absorbing a trailing end portion thereof. When luminescence by Ne is present, orange color luminescence can also be decreased thereby enhancing the color purity of the luminescence from RGB display cells.

Further, green color luminescence of the color plasma display has a broad band and there is a case in which a peak position thereof exists, for example, in a side of somewhat longer wavelength than that of green color required by the NTSC system, that is, in a side of yellowish green.

The inventors have found that the color purity can be enhanced by absorption of a short wavelength side of a dye having an absorption maximum at a wavelength of from 570 nm to 605 nm thereby absorb-trimming a long wavelength side of the green color luminescence and, further, trimming the unwanted luminescence, and/or shifting the peak.

In order to enhance the color purity of the red color luminescence as well as green color luminescence, it is preferable that minimum transmittance of the optical filter in a wavelength of from 570 nm to 605 nm is allowed to be 80% or less against a required transmittance of the red color luminescence at a peak position by using a dye having an absorption maximum in a wavelength of from 570 nm to 605 nm.

When the color purity of the blue color luminescence is low, the unwanted luminescence is decreased, a peak wavelength is shifted and a dye to absorb bluish green color luminescence may be used, in the same manner as in the cases of red color luminescence and green color luminescence. Further, absorption by the dye decreases incidence of an external light into the phosphor thereby allowing the reflection of the external light on the phosphor to be decreased. These procedures can also enhance the color purity and contrast.

As techniques of allowing a dye to be contained in the optical filter according to the invention, there are following methods:

(1) a method that uses a polymer film in which at least one dye is kneaded in a transparent resin;

(2) a method that uses a polymer film prepared by the steps of:

disperse-dissolving at least one dye in a concentrated resin solution of a resin or a resin monomer/an organic solvent; and subjecting the resultant concentrated resin solution containing the dye to casting processing;

(3) a method that uses a material prepared by the steps of:

adding at least one dye to a mixture of a resin binder and an organic solvent to prepare a coating material; and applying the thus-prepared coating material on a transparent substrate; and (4) a method that uses a transparent adhesive containing one or a plurality of dyes.

The term "contain" as used herein is intended to include states of being contained in a substrate, being in a layer such as a coating film and being in an adhesive as well as states of being coated on surfaces of the substrate and the layer. One or a plurality of methods are selected from these methods (1) to (4).

As for dyes, ordinary dyes or pigments which have a desired absorption wavelength in a visible region may be permissible. Types thereof are not particularly limited; however, examples of such dyes and pigments include organic dyes which are ordinarily available in the market such as anthraquinone type, phthalocyanine type, methine type, azomethine type, oxazine type, azo type, styryl type, coumarin type, porphyrin type, dibenzofuranone type, diketopyrrolopyrrole type, rhodamine type, xanthene type, and pyrromethene type dyes. The type and concentration thereof are determined depending on an absorption wavelength and absorption coefficient of the dye, a color tone of a transparent electrically conductive layer, transmission characteristics and transmittance required for the optical filter, a medium for dispersing the dye or a type and thickness of a coating film; on this occasion, the type and concentration of the dye are not particularly limited.

When a multi-layered thin film is used in the transparent electrically conductive layer (B), in a case in which, though the near-infrared ray cutting-off capacity as well as the electromagnetic wave shielding capacity is held, higher near-infrared ray cutting-off capacity is required, or in another case in which the transparent electrically conductive layer does not hold the near-infrared ray cutting-off capacity, it is permissible to use one or more near-infrared ray absorbing dyes together with the dyes described above in order to impart the filter for the display with the near-infrared ray cutting-off capacity.

No particular limitation is placed on the near-infrared absorbing dye, so long as it can supplement the near-infrared ray cutting-off capacity of the transparent electrically conductive layer and can absorb an intense near-infrared ray emitted from the plasma display to such an extent as is suitable for practical purposes; further, no particular limitation is placed on the concentration of the near-infrared ray absorbing dye. Examples of such near-infrared ray absorbing dyes include phthalocyanine type compounds, anthraquinone type compounds, dithiol type compounds, and diiminium type compounds.

Since a temperature of a panel surface of the plasma display panel is high and a temperature of the optical filter is elevated particularly in a high temperature atmosphere, it is preferable that the dye to be used in the invention has thermal resistance, for example, such that it does not significantly deteriorate itself by being decomposed at 80° C. or the like.

Further, there are some dyes which are deficient in light resistance as well as thermal resistance. When deterioration thereof by luminescence of the plasma display or an ultraviolet ray and a visible light ray of the external light comes to be a problem, it is important to decrease deterioration of the dye to be caused by the ultraviolet ray by means of using a member which contains an ultraviolet ray absorbing agent or another member which does not allow an ultraviolet ray to pass therethrough, or to use a dye which is not significantly deteriorated by the ultraviolet ray or the visible light ray.

The same is true with cases of heat, light, moisture and a mixed environment thereof. When the dye is deteriorated, the transmission characteristics of the optical filter are changed.

As a practical matter, a case in which the surface temperature of the plasma display panel goes up to a range of from 70° C. to 80° C. is stipulated in Japanese Unexamined Patent Publication JP-A 8-220303 (1996). Further, light emitted from the plasma display panel is stipulated, for example, as 300 cd/m$^2$ (Fujitsu Limited, Image Site, Catalog AD 25-000061C October, 1997M) whereupon, when light having this value is irradiated for 20,000 hours provided that a solid angle is $2\pi$, such irradiation comes to be $2\pi \times 20,000 \times 300 = 38,000,000$ (lx·hr); therefore, it is understood that light resistance of several ten millions (lx·hr) is practically required.

Further, in order to disperse a dye in a medium or a coating film, a dissolving property of the dye into an appropriate solvent is important. It is permissible to allow two or more dyes having different absorption wavelengths from each other to be contained in one medium or coating film.

The optical filter according to the invention has excellent transmission characteristics and transmittance which do not significantly impair luminance and visibility of the color plasma display and can enhance color purity and contrast of luminescent color of the color plasma display. The inventors have found that, when at least one of one or more dyes which are to be contained is a tetraazaporphyrin compound, since the tetraazaporphyrin compound has a major absorption wavelength in a wave length same as or similar to that of unwanted luminescence of from 570 to 605 nm which is particularly required to be decreased and has a comparatively small absorption wavelength band, loss of luminance derived from absorption of favorable luminescence can be reduced; hence, an optical filter which is excellent in capacity for enhancing transmission characteristics, transmittance, color purity and contrast of luminescence color was able to be obtained.

In the optical filter according to the invention, the methods (1) to (4) which allow the dye to be contained can be conducted in at least one layer of a polymer film (A) containing a dye; a transparent adhesive layer containing a dye (C) or (D) to be described below; a functional transparent layer containing a dye (E) to be described below; and the hard coat layer containing a dye (F) described above. The functional transparent layer containing a dye (E) to be described below may be any one of a film which contains a dye and has various functions; a material in which a film that contains a dye and has various functions is formed on a polymer film; and a material in which a film having various functions is formed on a substrate containing a dye.

Further, according to the invention, at least two dyes having different absorption wavelengths from each other may be contained in one medium or coating film, or at least two dye layers may be present.

First of all, the method (1) which comprises kneading a resin together with a dye and hot-molding the thus-kneaded resin will be described. It is preferable to use a resin material which has transparency as high as possible when formed into a plastic plate or a polymer film. Specific examples of such resin materials include, but by no means limited to, polyethylene terephthalate, polyether sulfone, polystyrene, polyethylene naphthalate, polyarylate, polyether ether ketone, polycarbonate, polyethylene, polypropylene, polyamides such as nylon 6 and the like, polyimides, cellulose type resins such as triacetylcellulose and the like, polyurethane, fluororesin such as polytetrafluoroethylene and the like, vinyl compounds such as polyvinyl chloride and the like, polyacrylic acid, polyacrylic acid esters, polyacrylonitrile, addition polymers of vinyl compounds, polymethacrylic acid, polymethacrylic acid esters, vinylidene compounds such as polyvinylidene chloride and the like, copolymers of vinyl compounds or fluorine-containing compounds such as a vinylidene fluoride/trifluoroethylene copolymer, an ethylene/vinyl acetate copolymer and the like, polyethers such as polyethylene oxide and the like, epoxy resins, polyvinyl alcohol, polyvinyl butyral and the like.

As to a preparation method, a processing temperature, a film-forming condition and the like may vary somewhat depending on a dye used and a base polymer. However, there are usually following methods:

(i) a method in which a dye is mixed to powders or pellets of a base polymer, and the resulting mixture is heat-melted at a temperature of from 150 to 350° C. and formed into a plastic plate;

(ii) a method in which a film is formed by an extruder;

(iii) a method in which a raw film is prepared by an extruder and, then, uniaxially stretched or biaxially stretched to a size two to five times an original size at a temperature of from 30 to 120° C. to form a film having a thickness of from 10 to 200 μm; and the like.

An additive commonly used at the time of molding resins, such as a plasticizer or the like, may be added during kneading. Although an amount of the dye to be added may vary depending on absorption coefficient of the dye, thickness of a polymeric molded article to be made, intended absorption intensity, intended transmission characteristics and transmittance and the like, it usually ranges from 1 ppm to 20%, based on the weight of the polymeric molded article as a substrate.

In the method (2) which is a casting method, a dye is add-dissolved in a concentrated solution of resin in which a resin or a resin monomer is dissolved in an organic solvent and, on this occasion, a plasticizer, a polymerization initiator, or an anti-oxidant is added, as desired, and the resultant concentrated solution of resin is poured onto a mold or a drum which has a required surface contour to obtain a plastic plate or a polymer film through subsequent solvent evaporation/drying or polymerization/solvent evaporation/drying processing.

Examples of resins or resin monomers to be ordinarily used include aliphatic ester type resins, acrylic resins, melamine resins, urethane resins, aromatic ester type resins, polycarbonate resins, aliphatic polyolefin resins, aromatic polyolefin resins, polyvinyl type resins, polyvinyl alcohol resins, polyvinyl type modified resins (PVB, EVA and the like) and a resin monomer of a copolymer resin thereof.

Examples of solvents to be used include halogen type, alcohol type, ketone type, ester type, aliphatic hydrocarbon type, aromatic hydrocarbon type, and ether type solvents and a mixture type thereof.

Although a concentration of the dye may vary depending on absorption coefficient of the dye, thickness of the plate or the film, intended absorption intensity, intended transmission characteristics and transmittance and the like, it is usually in a range of from 1 ppm to 20%, based on the weight of the resin monomer.

Further, a concentration of the resin is usually in a range of from 1 to 90%, based on the entire coating material.

As to the method (3) which comprises preparing a coating material and, then, performing a coating operation, employed are a method in which a dye is dissolved in a binder resin and an organic solvent to prepare a coating material, a method in which a dye that has previously been pulverized (50 to 500 nm) is dispersed in an uncolored acrylic emulsion-based coating material to prepare an acrylic emulsion-based aqueous coating material and the like.

In the former method, an aliphatic ester type resin, an acrylic resin, a melamine resin, an urethane resin, an aromatic ester type resin, a polycarbonate resin, an aliphatic polyolefin resin, an aromatic polyolefin resin, a polyvinyl type resin, a polyvinyl alcohol resin, a polyvinyl type modified resin (PVB, EVA or the like) or a copolymer resin thereof is usually used as a binder resin. As the solvent is used a halogen type, alcohol type, ketone type, ester type, aliphatic hydrocarbon type, aromatic hydrocarbon type, or ether type solvents, or a mixture type thereof.

Although a concentration of the dye may vary depending on absorption coefficient of the dye, thickness of such coating, intended absorption intensity, intended visible light transmittance and the like, it is usually in a range of from 0.1 to 30%, based on the weight of the binder resin.

Further, a concentration of the binder resin is usually in a range of from 1 to 50%, based on the entire coating material.

The acrylic emulsion-based aqueous coating material in the latter method can also be obtained, in the same way as in the former method, by dispersing a dye which has previously been pulverized (50 to 500 nm) in an uncolored acrylic emulsion-based coating material. An additive commonly used in a coating material, such as an antioxidant or the like, may be added to the coating material.

The coating material prepared according to any one of the methods described above is applied on a transparent polymer film, a transparent resin, a transparent glass or the like by means of a bar coater, a blade coater, a spin coater, a reverse coater, a die coater, a spray gun or the like in a known coating manner to prepare a substrate which containing a dye.

A protective layer may be provided on a coated surface in order to protect a coated surface, or another component of the optical filter may be bonded to the coated surface in such a manner as to protect the coated surface.

In the method (4) which uses an adhesive containing a dye, there may be used an adhesive in sheet form or in liquid form such as an acrylic adhesive, a silicone type adhesive, a urethane type adhesive, a polyvinyl butyral adhesive (PVB), an ethylene-vinyl acetate (EVA) type adhesive, a polyvinyl ether, a saturated amorphous polyester, a melamine resin or the like after being added with the dye of from 10 ppm to 30%.

In these methods, in order to enhance light resistance of the optical filter containing the dye, an ultraviolet ray absorbing agent can also be contained together with the dye. A type and a concentration of the ultraviolet absorbing agent are not particularly limited.

(Electrode)

In an appliance requiring electromagnetic wave shielding, an electromagnetic wave is shielded by disposing a metal layer inside a case of the appliance or by using the case made of an electrically conductive material. When transparency is required as in a display, an optical filter having an electromagnetic wave shielding function imparted by a transparent electrically conductive layer formed in a window-like shape is disposed. Since the electromagnetic wave absorbed in the transparent electrically conductive layer induces electric charge in the optical filter, this electric charge must be escaped from the optical filter by grounding it. Otherwise the optical filter acts as an antenna for emitting electromagnetic waves again, resulting in a reduction in electromagnetic wave shielding capacity. Accordingly, it is necessary that the optical filter and a ground portion of a main body of the display are electrically connected with each other. For this reason, when the transparent adhesive layer (D) and the functional transparent layer (E) are formed on the transparent electrically conductive layer (B), it is preferable that the transparent adhesive layer (D) and the functional transparent layer (E) are formed on the transparent electrically conductive layer (B) such that a conduction portion is left intact. An electrode is formed by using this conduction portion. No particular limitation is placed on a form of this conduction portion, but it is important that a clearance through which an electromagnetic wave is leaked is not present between the optical filter and the main body of the display.

In order to secure a good electrical connection, an electrode may be formed by providing an electrically conductive material to the conduction portion. A shape thereof to be provided is not particularly limited. However, it is advantageous that the whole conduction portion is covered.

The electrode according to the invention may be formed by allowing each of the layers, containing a transparent electrically conductive layer, which constitute the optical filter to contact the electrically conductive material. In the optical filter according to the invention, it can be observed that at least the transparent electrically conductive layer and a film for protecting it are stratified. A desired electrode can be obtained so long as an appropriate electrically conductive material is in contact with each layers of the transparent electrically conductive layer.

On this occasion, when an edge portion of the transparent adhesive layer formed on the transparent electrically conductive layer is withdrawn inside from the edge portion of the transparent electrically conductive layer and an electrode is formed by using an electrically conductive paste, it is favorable that the electrically conductive paste is penetrated into a clearance between the edge portion of the transparent adhesive layer and the edge portion of the transparent electrically conductive layer to increase a contacting area between the transparent electrically conductive layer and the electrode.

Further, it is permissible that an electrically conductive tape such as a copper tape is interposed between the transparent electrically conductive layer and the transparent adhesive layer which is bonded thereon and, then, a portion of the electrically conductive tape is led to an outside of the electromagnetic wave shielding body as a conduction portion to form an electrode. On this occasion, the electrically conductive tape led externally becomes a substantial electrode.

Further, it is permissible that a clearance which extends from the transparent electrically conductive layer to an outermost surface of the laminate is provided to form an electrode. No particular limitation is placed on a shape of the clearance as viewed from the surface, and it is permissible that the shape is either circular or polygonal. Further, the clearance may be formed in a line shape. There is no particularly specified size in regard to individual clearances as viewed from the surface. However, when the size is unduly large, the clearance overlaps a visibility portion; this situation is not favorable. A position of the clearance to be formed is not particularly limited so long as it avoids the visibility portion. As a natural course, the position comes to be in a neighborhood of an edge portion. No particular limitation is placed on a number of clearances to be formed; however, it is preferable that the clearances are formed as many as possible over an entire periphery to enhance efficiency of leading out an electric current. It is sufficient to dispose the clearance between the transparent electrically conductive layer and the outermost surface of the laminate; on this occasion, it is preferable that the clearance passes through the transparent electrically conductive layer for an intention of increasing a contact area with an electrode to be formed.

There is also no particular designation in regard to a member to fill the clearance. The clearance may be filled with a metallic material or a metallic paste. On this occasion, the member which fills the clearance becomes a substantial electrode.

It is preferable that an electrode is disposed in a peripheral portion of the transparent electrically conductive layer (B) in a continuous manner. Namely, it is preferable that the conduction portion is disposed in frame form in a place excluding a central portion of the representation portion of the display.

However, even in a case in which the electrode is not formed in the entire periphery, since there is a given electromagnetic wave shielding capacity therein, there are many opportunities in which the case is permissible by taking into consideration a quantity of electromagnetic wave emission and a quantity of allowable electromagnetic wave leakage in a comprehensive manner.

For example, when it is designed that the electrically conductive material is provided only on sides of a rectangle facing with each other to form electrodes, since these electrodes can be formed by a roll-to-roll method or in a roll state as it is, an optical filter can conveniently be prepared with extremely favorable production efficiency. Further, this technique can also be utilized when the electrically conductive tape is used as an electrode, as previously shown.

There is no particular problem, even when another electrode is formed in another portion of the rectangle in addition to the portion of two sides of the rectangle facing with each other, or when a part in which an electrode is not formed is present within a portion of such two sides facing each other.

In a process of forming the electrode, the electrode, covering the conduction portion serves also as a protection for the transparent electrically conductive layer (B) which is inferior in environmental resistance and scratch resistance. From the viewpoint of electric conductivity, corrosion resistance, adhesiveness to the transparent electrically conductive film and the like, examples of such materials as can be used for covering the conduction portion include an elemental substance of silver, gold, copper, platinum, nickel, aluminum, chromium, iron, zinc, carbon and the like, an alloy made of two or more of these elemental substances, a mixture of an synthetic resin and either any one of these elemental substances or an alloy thereof, and a paste which is a mixture of borosilicate glass and either any one of these elemental substances or an alloy thereof. In forming the electrode, any one of various conventionally known methods such as a metal plating method, a vacuum deposition method, a sputtering method and the like can be adopted. Further, when a paste or the like is used, other conventionally known methods such as a printing method, a coating method and the like can also be adopted.

No particular limitation is placed on an electrically conductive material to be used, so long as it is electrically conductive. Ordinarily, a material having an electrically conductive property in paste form such as a silver paste and the like can be employed.

As a method of covering the conduction portion, when a material in paste form is used, such covering can be performed by first applying it on a side surface of each layer and, then, drying it. It is permissible that the material is applied to a side surface of a film in a rolled state, or the material is applied on the side surface of the film by a roll-to-roll method while the film is being unwound. Further, the electrically conductive material in tape form can also be employed.

As a method of application, from the viewpoint of efficiency and accuracy, screen printing is employed in many cases.

Further, when an electrode is formed by filling a clearance by a metallic member, it is permissible that the electromagnetic wave shielding body itself has not previously been treated. A metallic ground portion in which a screw hole is formed is previously prepared in a peripheral portion of a display apparatus and, then, after the electromagnetic wave shielding body is bonded to a representation portion of the display apparatus including the metallic ground portion, an electrically conductive screw may be fit in the screw hole of the metallic ground portion such that it penetrates the electromagnetic wave shielding body. On this occasion, such an electrically conductive screw substantially serves as an electrode. When this technique is utilized, not only the electromagnetic wave shielding body can be prepared by the roll-to-roll method with high productivity, but also the electrode can easily be formed over an entire peripheral portion of the electromagnetic wave shielding body.

(Anti-Reflection Layer)

An anti-reflection layer, being formed on a substrate, denotes a layer for decreasing light ray reflectance on a substrate surface.

Specifically, as the anti-reflection layer, there are two types. A first type of the anti-reflection layer is formed by a single layer, for example, having an optical thickness of ¼ wavelength, of a thin film or the like which is made of a fluorine type transparent polymer resin, magnesium fluoride, a silicone type resin or silicon oxide and in which refractive index in a visible light region is as low as 1.5 or less, preferably 1.4 or less. A second type of the anti-reflection layer is formed by laminating two or more layers, having different refractive indices from each other, of a thin film made of an inorganic compound such as a metal oxide, a fluoride, a silicate, a borate, a carbide, a nitride, a sulfide or the like, or an organic compound such as a silicone type resin, an acrylic resin, a fluorinated resin or the like. The anti-reflection film formed by a single layer is easy to manufacture but is inferior in an anti-reflection property to that of such a multi-layer laminate. The multi-layer laminate has anti-reflection capacity over a wide range of wavelength and has no restriction on an optical design based on optical characteristics of a base film. In forming such an inorganic thin film, it is sufficient to use a conventional known method such as a sputtering method, an ion-plating method, an ion beam assist method, a vacuum vapor deposition method, a wet coating method or the like.

A film in which the anti-reflection layer is formed on a substrate denotes an anti-reflection film.

(Anti-Glare Layer)

An anti-glare layer, being formed on a substrate, denotes a layer for prevent glare of a transmitted light passing through a substrate or of a reflected light from a surface.

The anti-glare layer is provided with minute irregularities having a size of from about 0.1 to about 10 μm on a surface thereof. Specifically, the anti-glare layer is obtained by dispersing particles of an inorganic or organic compound such as silica, melamine, an acrylate or the like in a thermosetting or photo-curable resin such as an acrylic resin, a silicone type resin, a melamine type resin, an urethane type resin, an alkyd type resin, fluorine type resin to prepare ink; applying the thus-prepared ink on a transparent polymer film by a method such as a bar coating method; a reverse coating method; a gravure coating method; a die coating method; a roll coating method; and the like; and curing the thus-applied ink.

An average diameter of the particles is in a range of from 1 to 40 μm. Alternatively, the anti-glare property can also be obtained by the steps of:

applying a thermosetting or photo-curable resin such as an acrylic resin, a silicone type resin, a melamine type resin, an urethane type resin, an alkyd type resin, fluorine type resin or the like on a substrate; and pressing the thus-applied resin by a mold having a desired haze or a surface contour to cure the resin.

Further, the anti-glare layer can also be obtained by performing a chemical treatment on a base film in the same manner as in etching a glass plate by means of hydrofluoric acid or the like. On this occasion, a haze can be controlled by a period of time of such treatment and a property of such chemical. The haze is measured by, for example, in accordance with ASTM standard D1003-61 whereupon there is a tendency that, as a rate of light scattering caused by the surface irregularities becomes larger, the haze becomes higher. The method of preparing the anti-glare layer is not limited to those methods described above so long as appropriate irregularities are formed on the surface of the anti-glare layer. The haze of the anti-glare layer is from 0.5% to 20% and preferably from 1% to 10%. When the haze is unduly low, an anti-glare property becomes insufficient, while, when the haze is unduly high, transmittance of parallel light rays is reduced whereupon the visibility of the display is deteriorated.

A film on which the anti-glare layer is formed is an anti-glare film.

(Polarizing Plate)

A polarizing plate, being an optical element for taking out a component which oscillates only in one direction from light, is essential for an LCD element. The polarizing plate is in a film state in many cases and, accordingly, often referred to also as a polarizing film.

The polarizing plate according to the invention is not particularly limited so long as it can ordinarily be used for an LCD.

There are many cases in which the polarizing film is formed by first applying polyvinyl alcohol (PVA) on a polymer film and, then, doping iodine in the polymer film. The resultant film is uniaxially stretched thereby arranging doped iodine molecules in a same direction. On this occasion, iodine is oriented along with the polymer of the film and, as a result, iodine molecules are arranged in a same direction.

Natural light oscillates in a direction perpendicular to a forward direction at any time and comprises light which oscillate in parallel with (vertical) and in a direction perpendicular (transverse) to a longitudinal axis of an iodine molecule in the polarizing film, respectively. It goes without saying that there is also light which oscillates at an angle intermediate to those of the light described above. On this occasion, only the light which oscillate in parallel with and in a direction perpendicular to the longitudinal axis of the iodine molecule, respectively, are reviewed. In a case of iodine, light absorption coefficient in a direction perpendicular to or in parallel with that of a longitudinal axis of the molecule differs to a great extent depending on deviation of electron density of this molecule. About 100% of the light which oscillates in a direction perpendicular to the longitudinal axis of the molecule is transmitted, whereas, almost none of the light which oscillates in parallel with the longitudinal axis of the molecule is transmitted while being absorbed by iodine. Therefore, the light which can pass through the polarizing film is only light which is perpendicular to the longitudinal axis of the iodine molecule and any other light than the light described above is absorbed by iodine. In this manner, linearly polarized light (plane-polarized light) which oscillates only in one direction can be obtained from the natural light.

(Size)

According to the invention, in reference to a large-sized display element, an effect according to the invention can be expected particularly in a case in which a screen size thereof is 21 inches or more. On this occasion, the screen size is defined by diagonal length. Further, when the size is 37 inches or more, larger effect can be expected and, still further, when the size is 42 inches or more, still larger effect can be expected. In regard to the display element in which the screen size is less than 21 inches, safety standards defined by Japan Electrical Appliance and Material Control Law can be satisfied by using conventional members. However, even in the display element in which the screen size is less than 21 inches, there is an effect in that safety is further improved by using a transparent adhesive layer characterized by a low elasticity according to the invention.

In regard to the display element for a small-sized portable terminal according to the invention, the effect according to the invention can be expected in all screen sizes thereof. The screen size of a small-sized display element used for the small-sized portable terminal is about 1 inch; on this occasion, no matter how small, when external impact is applied thereto, for example, by dropping it and the like, substrate glass of the display element is sometimes broken. The display element specified according to the invention is much less liable to such breakage thereby being effective. Further, recently, there is a tendency in which the screen size of the display element provided in the small-sized portable terminal is becoming larger. As the screen size becomes larger, the substrate glass of the display element becomes more brittle; also for this reason, it will be more effective that the display element according to the invention is used.

(Analysis Method)

In measuring Young's modulus of a transparent adhesive layer characterized by low elasticity according to the invention, ordinary techniques conventionally used can be used.

For example, the transparent adhesive layer is exposed and, then, a load is applied on a unit area of a surface of the thus-exposed layer whereupon Young's modulus can be determined from weight of the load and the resultant deviation of the transparent adhesive layer.

A layer composition and a state of each layer of the optical filter can be examined through an observation by an optical microscope, a scanning electron microscope (SEM) or a transmission electron microscope (TEM).

A surface atomic composition of the transparent electrically conductive film can be measured by a method such as Auger electron spectroscopy (AES), X-ray fluorescence (XRF), X-ray microanalysis (XMA), Rutherford back scattering spectrometry (RBS), X-ray photoelectron spectroscopy (XPS), Ultraviolet photoemission spectroscopy (UPS), Infrared spectroscopy (IR), Raman scattering spectroscopy, Secondary ion mass spectroscopy (SIMS), Ion scattering spectroscopy (ISS) or the like. Further, an atomic composition and thickness in the film can be examined by performing Auger electron spectroscopy (AES) or Secondary ion mass spectroscopy (SIMS) in a depth direction.

When an anti-glare film, an anti-reflection film or the like are previously bonded on the transparent electrically conductive film, either of the former two films are peeled off to expose a surface of the latter film and, then, the techniques described above may be applied for examining the latter film.

A composition and a construction of a polymer, a dye to be used according to the invention can be examined by using an ordinary technique for analyzing the composition or construction, after the dye is dissolved in an appropriate solvent. For example, Nuclear magnetic resonance spectroscopy (NMR), Infrared spectroscopy (IR), Raman scattering spectroscopy, Mass spectroscopy (MAS) or the like can be used.

(Preparation of Transparent Electrically Conductive Film)

The invention is further illustrated by the following examples. However, these examples are not to be construed to limit the scope of the invention.

A thin film constituting a transparent electrically conductive layer (B) in the examples is formed on one major surface of a substrate according to a magnetron DC sputtering process. Thickness of the thin film is a value determined from film-forming conditions, and is not a value obtained by actually measuring the thin film.

When an ITO thin film is used as a high-refractive-index transparent film layer (a), the film is formed by using an indium oxide/a tin oxide sintered body (composition ratio is $In_2O_3:SnO_2=90:10$ wt %) as a target and an argon-oxygen gaseous mixture (with a total pressure of 266 mPa and a partial pressure of oxygen of 5 mPa) as a sputtering gas.

When a tin oxide thin film is used as a high-refractive-index transparent film layer (a), the film is formed by using a tin oxide sintered body as a target and an argon-oxygen gaseous mixture (with a total pressure of 266 mPa and a partial pressure of oxygen of 5 mPa) as a sputtering gas.

When a silver thin film is used as a metallic thin film layer (b), the film is formed by using silver as a target and argon gas (with a total pressure of 266 mPa) as a sputtering gas.

When a silver-palladium alloy thin film is used as a metallic thin film layer (b), the film is formed by using a silver-palladium alloy (palladium content being 10 wt %) as a target and argon gas (with a total pressure of 266 mPa) as a sputtering gas.

Further, surface resistance of the transparent electrically conductive layer is measured according to a four-probe method (probe spacing being 1 mm). Further, with respect to visible light ray reflectance (Rvis) of a surface thereof, first of all, a small piece is cut out of an object to be measured and, next, after a transparent adhesive layer is removed therefrom and a surface thereof in a polymer film (A) side is roughened by a sandpaper, the surface is deprived of a reflection property by being sprayed by a matting black paint. A total light ray reflectance of the thus-treated small piece in a visible wavelength region is measured by a spectrophotometer (U-3400; manufactured by Hitachi, Ltd.) using an integrating sphere (a light ray incidence angle being 6°). From the reflectance thus obtained, the visible light ray reflectance (Rvis) is calculated in accordance with JIS R3106.

(Measurement of Young's Modulus)

Young's modulus of a transparent adhesive layer is measured by pressing a tip of a measuring rod made of stainless steel having a cross-sectional area of $1\times10^{-6}$ $m^2$ against a surface of the transparent adhesive layer while applying a specified load on the measuring rod. Young's modulus (G) is determined from a relation between intensity (F) of the load thus applied and depth (D) in which the transparent adhesive layer is dented by being pressed by the measuring rod. Such a relation is expressed by a relational expression: $F=G\times D$.

(Penetration)

Penetration is determined in accordance with JIS K2207-1991-50 g load.

(Steel Ball Drop Test)

Following procedures are performed in Examples 1 to 7:

A steel ball having a diameter of 50 mm and a weight of 500 g is dropped from a height of 1,300 mm on a center portion of a representation surface of a display element in a pendulum manner. When a substrate glass of the representation portion is broken and fragments of the thus-broken glass are scattered in front thereof, the test result is rated as "not passed". When such scattering is not generated, the test result is rated as "passed". Further, relative merits among display apparatuses rated "passed" are determined in accordance with a state of breakage.

Following procedures are performed in Examples 8 to 30:

A steel ball having a diameter of 50 mm and a weight of 500 g is dropped from a height of 1,300 mm on a center portion of a representation surface of a display element in a pendulum manner. A distance to which fragments of broken glass are scattered is examined. A distance to a farthest point which glass in a mass of 1 g or more reached among fragments of broken glass which have been scattered is taken as a test result.

(Drop Test)

Following procedures are performed in Examples 1 to 7:

A display element is dropped from a height of 750 mm on a plate. The plate is a solid plate having a thickness of 20 mm. A folded board prepared by folding two plates each having a thickness of 20 mm is placed on a concrete and, then, the solid plate is placed on the folded board.

In a case in which fragments of broken glass having a weight of 15 g or more as a single piece or 45 g or more in total are scattered in a space provided between two barriers set 900 mm and 1,500 mm apart, respectively, in front of a display apparatus, or in a case in which fragments of broken glass having a weight of more than 1 g are scattered beyond a barrier which is set 1,500 mm apart in front of a display apparatus, the test result is rated as "not passed" while, in each of the above described cases, when such fragments having less than the above-defined weight are scattered, the test result is rated as "passed". On this occasion, even in categories of "not passed" and "passed", scattering states of fragments of the broken glass are taken into consideration before making a final judgment.

Following procedures are performed in Examples 8 to 30:

A display element is dropped from a height of 750 mm on a plate. The plate is a solid plate having a thickness of 20 mm. A folded board prepared by folding two plates each having a thickness of 20 mm is placed on a concrete and, then, the solid plate is placed on the folded board.

A distance in a forward direction from the display apparatus to which fragments of broken glass are scattered was examined. A distance to a farthest point which glass in a mass of 1 g or more reached among fragments of broken glass which have been scattered is taken as the test result.

In a case in which fragments of broken glass having a weight of 15 g or more as a single piece or 45 g or more in total are scattered in a space provided between two barriers set 900 mm and 1,500 mm apart, respectively, in front of a display apparatus, or in a case in which fragments of broken glass having a weight of more than 1 g are scattered beyond a barrier which is set 1,500 mm apart in front of a display apparatus, the test result is rated as "not passed" while, in each of the above described cases, when such fragments having less than the above-defined weight are scattered, the test result is rated as "passed". On this occasion, even in categories of "not passed" and "passed", scattering states of fragments of the broken glass are taken into consideration before making a final judgment. With regard to Young's modulus of the transparent adhesive layer

EXAMPLE 1

(Preparation of Transparent Electrically Conductive Film)

Designating a biaxially stretched polyethylene terephthalate (hereinafter referred to also as PET) film (188 µm thick) as a polymer film (A), a transparent electrically conductive layer (B) comprising seven layers in total made up of an ITO thin film (40 nm thick), a silver thin film (11 nm thick), an ITO thin film (95 nm thick), a silver thin film (14 nm thick), an ITO thin film (90 nm thick), a silver thin film (12 nm thick) and an ITO thin film (40 nm thick) in order of precedence as viewed from a side of the PET film is formed on one major surface of the PET film to prepare a transparent laminate comprising the transparent electrically conductive layer (B) having a surface resistance of 2.2 Ω/square.

A cross-section of a laminate (PET film/transparent electrically conductive layer) is shown in FIG. 1 as an example of a polymer film (A)/a transparent electrically conductive layer (B) according to the invention. As seen in FIG. 1, on a transparent polymer film 10, laminated are a high-refractive-index thin film layer 20, a metallic thin film layer 30, a high-refractive-index thin film layer 20, a metallic thin film layer 30, a high-refractive-index thin film layer 20, a metallic thin film layer 30 and a high-refractive-index thin film layer 20 in order of precedence.

(Preparation of Acrylic Adhesive)

100 parts of a monomer mixture liquid comprising vinyl acetate, octyl acrylate, ethyl acrylate and maleic acid at a mixing ratio of 20:70:10:7.5 and a mixture comprising azobisisobutylonitrile (AIBN) and methylene chloride at a mixing ratio of 0.2:20 are prepared. While the monomer mixture liquid and AIBN are stirred, they are heated up to a temperature at which a reflux starts. The reflux starts at around 74° C. Five minutes after the reflux is generated, 55 parts of methylene chloride starts to be added to the resultant mixture. Such addition is gradually performed consuming more than 3 hours. A final temperature of the reflux is about 50° C. After one hour has elapsed, 75 parts of toluene is added to the mixture. A reflux temperature is about 65° C. While keeping the mixture at this temperature, the mixture is further stirred for 6 hours. At this stage, polymerization of the mixture is terminated and, then, the mixture is cooled to room temperature.

A weight composition of a copolymer obtained by using a material mixing ratio described above comes to be approximately vinyl acetate:octyl acrylate:ethyl acrylate:maleic acid=20:70:10:7.5. A sample thus obtained is designated as a sample a (vinyl acetate being 20 wt %).

Subsequently, a sample having a different weight composition is prepared by changing ratios of materials to be mixed. In this embodiment, the weight composition is changed such that only the mixing ratio of vinyl acetate is changed. Samples having following mixing ratios of vinyl acetate are prepared: a sample b (vinyl acetate being 18 wt %), a sample c (vinyl acetate being 15 wt %), a sample d (vinyl acetate being 10 wt %), a sample e (vinyl acetate being 5 wt %), a sample f (vinyl acetate being 3 wt %) and a sample g (vinyl acetate being 2 wt %).

(Dispersion of Dye)

An organic dye is disperse-dissolved in a solvent of ethyl acetate/toluene (50:50 wt %) to prepare a diluting liquid for an acrylic adhesive. An acrylic adhesive and a diluting liquid containing a dye are mixed with each other at a mixing ratio of 80:20 wt % to prepare an adhesive stock solution. On this occasion, a refractive index and an extinction coefficient of the adhesive are 1.51 and 0, respectively.

As an organic dye, a dye PD-319 manufactured by Mitsui Chemicals, Inc. having an absorption maximum in a wavelength of 595 nm for absorbing an unnecessary luminescence emitted from a plasma display and a red color dye PS-Red-G manufactured by Mitsui Chemicals, Inc. for correcting chromaticity of white color luminescence are used to adjust the acrylic adhesive/the dye-containing diluting liquid such that these dyes are contained in a dried adhesive 1 in amounts of 1,150 (wt)ppm and 1,050 (wt)ppm, respectively.

(Formation of Adhesive Layer)

On a polyethylene terephthalate film (100 µm thick) having a surface which has been subjected to a peel-facilitating treatment, an adhesive stock liquid is applied by a gravure coating method such that thickness of a previously prepared tacking agent is allowed to be 100 µm thereby preparing an adhesive layer. A surface to be applied is the surface subjected to the peel-facilitating surface. Further, on the adhesive layer, a polyethylene terephthalate film (100 µm thick) having a surface which has been subjected to a peel-facilitating treatment is bonded to be in a double-tack state. Such bonding is performed such that the surface which has been subjected to the peel-facilitating treatment contacts the adhesive layer. It is preferable that a peel-facilitating layer to be used at this time has a higher peel-facilitating property than that of the peel-facilitating layer that is the surface on which the adhesive is first applied. Further, the polyethylene terephthalate film disposed on each surface of the transparent adhesive layer functions as a mold releasing film; on this occasion, it is supposed that the transparent adhesive layer having a higher peel-facilitating property than the other layer is to be first peeled off.

(Formation of Adhesive Layer to Transparent Electrically Conductive Film)

Such a transparent adhesive layer as obtained in the above is formed on a surface of a PET film of a transparent electrically conductive layer/a PET film. First of all, one of two mold releasing films which have each been bonded to both sides of the transparent adhesive layer is peeled off and, then, the resultant transparent adhesive layer is bonded on a transparent laminate. A composition of the resultant laminate comprises a transparent electrically conductive layer/a PET film/an adhesive/a mold releasing film.

(Preparation of Anti-Reflection Film)

A coating liquid in which a photopolymerization initiator is added to a multi-functional methacrylate resin and, further, ITO fine particles (average particle diameter: 10 nm) are dispersed thereto is coated on one major surface of a triacetyl cellulose (TAC) film (thickness: 80 μm; Young's modulus: 1,300 MPa) by a gravure coater and cured by an ultraviolet ray to form an electrically conductive hard coat film (film thickness: 3 μm) and, then, a fluorine-containing organic compound solution is coated on the thus-formed hard coat film by a microgravure coater and dry-cured at 90° C. to form an anti-reflection film (film thickness: 100 nm) having a refractive index of 1.4 whereupon an anti-reflection film is obtained as a functional transparent layer (E) having a hard coat property (pencil hardness in accordance with JIS K5400: 2H), a gas barrier property (in accordance with ASTM-E96, 1.8 g/m$^2$·day), an anti-reflection property (Rvis of surface: 1.0%), an antistatic property (surface resistance: 7×10$^9$ Ω/square) and an anti-fouling property. An adhesive/a diluting liquid comprising same raw materials as in the adhesive but not containing a dye is applied on the other major surface of the anti-reflection film and, then, dried to form a transparent adhesive layer (D) (adhesive 2) having a thickness of 25 μm and, thereafter, a mold releasing film is laminated on the thus-formed transparent adhesive layer.

(Preparation of Optical Filter)

A material of a transparent electrically conductive film/a PET film/an adhesive/a mold releasing film is cut into a size of 970 mm×570 mm and fixed on a supporting plate made of glass such that a surface of a transparent electrically conductive layer (B) comes on top. Further, an anti-reflection film is laminated only on an inside portion of the transparent electrically conductive layer (B) while leaving an electrically conduction portion intact such that 20 mm wide of a peripheral portion thereof is exposed.

Further, a silver paste (MSP-600F; manufactured by Mitsui Chemicals, Inc.) is screen-printed to an area of 22 mm wide of a peripheral portion of the transparent electrically conductive layer (B) such that the silver paste covers an exposed electrically conduction portion thereof and, then, dried to form an electrode of 15 μm thick. Thereafter, the resultant material is removed from the supporting plate to prepare an optical filter according to the invention having a mold releasing film on a surface of the transparent adhesive layer (C).

(Provision of Optical Filter)

Figure 2:
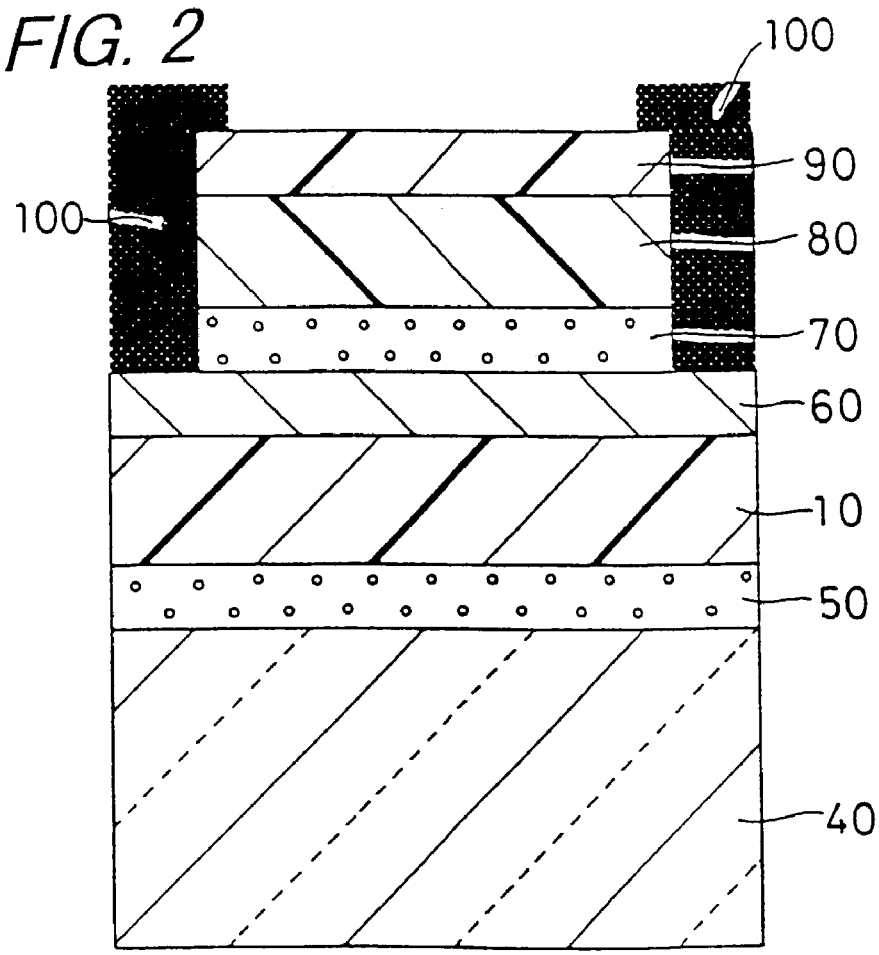
FIG. 2 is a cross-sectional view illustrating an example of a state when a laminate according to the invention is provided on a PDP.

Further, the optical filter is deprived of a mold releasing film and bonded to a front surface of a plasma display panel (representation portion: 920 mm×520 mm) by a sheet-feeding type laminator and, then, is subjected to an autoclave treatment under heating and pressure conditions of 60° C. and 2×10$^5$ Pa. An electrode of the optical filter and a ground portion of the plasma display panel are connected to each other by using an electrically conductive copper foil adhesive tape (510FR) manufactured by Teraoka Seisakusho Co., Ltd. to obtain a display apparatus having the optical filter according to the invention. A cross-section of the optical filter is shown in FIG. 2 as a cross-section illustrating an example of the optical filter according to the invention and a provided state thereof. As seen in FIG. 2, on the plasma display panel 40, laminated are a transparent adhesive layer 50 characterized by low elasticity, a transparent polymer film 10, a transparent electrically conductive layer 60, a transparent adhesive layer 70, a transparent polymer film 80 and an anti-reflection layer 90 in order of precedence. An electrode 100 is electrically connected to the transparent electrically conductive layer 60 such that the electrode 100 covers edges of the transparent adhesive layer 70, the transparent polymer film 80 and the anti-reflection layer 90.

(Impact Resistance Test)

Impact resistance of a PDP provided with an optical filter prepared in such a manner as described above is examined by a steel ball drop test and a drop test. Only when the PDP passes both of the tests, the PDP is judged as "passed", while, in other cases than the above case, the PDP is judged as "not passed". In any case of "passed" and "not passed", relative merits of the impact resistance are judged from test results thereof.

The evaluation results are shown in Table 1.

The transparent adhesive layer shows a favorable impact resistance when Young's modulus thereof is in a range of from 1×10$^2$ to 1×10$^6$ Pa. It is found that a laminate which can provide the PDP that passes the impact resistance test can be obtained. When the Young's modulus of the transparent adhesive layer is larger than 1×10$^6$ Pa or less than 1×10$^2$ Pa, it is found that sufficient impact resistance can not be obtained.

TABLE 1

| Sample No. | Content of vinyl acetate (wt %) | Young's modulus (Pa) | Impact resistance test | Comprehensive evaluation |
|---|---|---|---|---|
| A | 20 | 2,000,000 | Not passed | Bad |
| B | 18 | 100,000 | Passed | Good |
| C | 15 | 700,000 | Passed | Good |
| D | 10 | 30,000 | Passed | Very good |
| E | 5 | 1,000 | Passed | Very good |
| F | 3 | 100 | Passed | Good |
| G | 2 | 90 | Not passed | Bad |

EXAMPLE 2

The same procedures as in Example 1 are repeated except that a silicone type transparent adhesive layer is prepared and used as a transparent adhesive layer characterized by elasticity.

(Preparation of Silicone Type Adhesive)

Three resins and a catalyst, as described below, are prepared.

Resin P1,

A copolymer of phenyl methyl siloxane (concentration: 50 mol %), monophenyl siloxane (concentration: 15 mol %), monomethyl siloxane (concentration: 25 mol %) and diphenyl siloxane (concetration: 10 mol %); containing a zinc octate catalyst (0.6 wt %); and containing a hydroxyl group bonded to silicon.

Resin P2

A phenyl methyl vinyl siloxane copolymer comprising phenyl methyl siloxane (concentration: 60 mol %) and phenyl vinyl siloxane (concentration: 40 mol %)

Resin P3

A copolymer of phenyl methyl siloxane (50 mol %) and hydrogenated methyl siloxane (50 mol %).

Catalyst A

A xylene solution in which chloroplatinic acid (concentration: 0.2 wt %) is dispersed.

Preparation h

The resin P1, the resin P2 and the resin P3 are mixed in toluene at a weight ratio of 25:4.0:1.0 to prepare a 50% mixing liquid. Into this mixing liquid, 15 drops of the catalyst A are added. The resultant mixing liquid is designated as a sample h.

Preparation i

The same procedures as in the preparation h are repeated except that one drop of the catalyst A is added. The resultant mixing liquid is designated as a sample i.

Preparation j

The same procedures as in the preparation h are repeated except that the catalyst A is not added. The resultant mixing liquid is designated as a sample j.

The evaluation results are shown in Table 2.

It is found that, even when the silicone type adhesive is used, the PDP having the transparent adhesive layer can satisfy safety standards for impact resistance by lowering the Young's modulus of the transparent adhesive layer in the same manner as in Example 1 in which the acrylic adhesive is used.

TABLE 2

| Sample No. | Chloroplatinic acid (Number of drops) | Young's modulus (Pa) | Impact resistance test | Comprehensive evaluation |
| --- | --- | --- | --- | --- |
| H | 15 | 3,000,000 | Not passed | Bad |
| I | 1 | 700,000 | Passed | Good |
| J | 0 | 30,000 | Passed | Very good |

COMPARATIVE EXAMPLE 1

The same procedures as in Example 1 are repeated except that a double-tack tape (5510; manufactured by Sekisui Chemical Co., Ltd.) is used as a transparent adhesive layer.

The evaluation results are shown in Table 3.

It is found that the PDP having a conventionally used transparent adhesive is poor in impact resistance and the Young's modulus of the transparent adhesive is the same as the sample which is poor in impact resistance in Examples 1 and 2.

TABLE 3

| Transparent adhesive | Young's modulus (Pa) | Impact resistance test | Comprehensive evaluation |
| --- | --- | --- | --- |
| Double-tack tape (manufactured by Sekisui Chemical Co., Ltd. 5510) | 2,000,000 | Not passed | Bad |

EXAMPLE 3

The same procedures as in Example 1 are repeated except for procedures described below.

An anti-reflection film is prepared in the same manner as in Example 1. However, a biaxially stretched polyethylene terephthalate (hereinafter referred to also as PET) film (thickness: 188 μm; Young's modulus: 4,000 MPa) is used instead of triacetyl cellulose (TAC) film as a base film.

A transparent electrically conductive film is prepared on a surface reverse to a surface on which an anti-reflection layer of this anti-reflection film is formed in the same manner as in Example 1.

An acrylic adhesive (sample No. e) is prepared in the same manner as in Example 1 and, then, a dye is dispersed in the thus-prepared acrylic adhesive to form an adhesive layer.

Such a transparent adhesive layer as obtained in the above is formed on a transparent electrically conductive film of an anti-reflection film/a PET film/a transparent electrically conductive film. First of all, one of two mold releasing films which have each been bonded to both surfaces of the transparent adhesive layer is peeled off and, then, the resultant transparent adhesive layer is bonded on a transparent laminate to prepare an optical filter.

A composition of the resultant laminate comprises an anti-reflection film/a PET film/a transparent electrically conductive film/an adhesive/a mold releasing film.

The resultant laminate is cut into a size of 970 mm×570 mm to prepare an optical filter.

Further, the optical filter is deprived of a mold releasing film and bonded to a front surface of a 42-inch type plasma display panel (representation portion: 920 mm×520 mm) by a sheet-feeding type laminator and, then, is subjected to an autoclave treatment under heating and pressure conditions of 60° C. and $2 \times 10^5$ Pa.

Further, a hole is previously provided on the periphery of a representation portion of a front surface of a plasma display panel for fastening it with an exterior part by a screw. Such a screw hole has electric conduction with the exterior part off the PDP and is allowed to be earthed.

Figure 3:
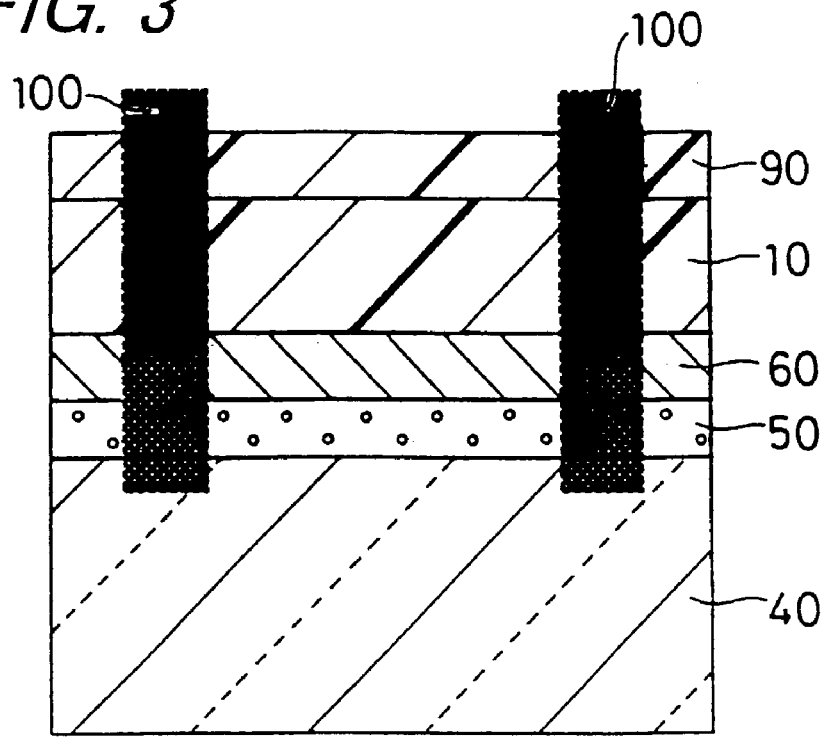
FIG. 3 is a cross-sectional view illustrating another example of a state when a laminate according to the invention is provided on a PDP.

The optical filter is bonded to the PDP such that the optical filter covers the screw hole. The screw is fixed in the screw hole such that it penetrates from a surface of the optical filter through the whole body thereof. It is necessary that the screw to be used has electric conductivity. A cross-section of the optical filter is shown in FIG. 3 as a cross-section illustrating another example of the optical filter according to the invention and a provided state thereof. As seen in FIG. 3, on the plasma display panel 40, laminated are a transparent adhesive layer 50 characterized by low elasticity, a transparent electrically conductive layer 60, a transparent polymer film 10, and an anti-reflection layer 90 in order of precedence. An electrode 100 is provided such that the electrode 100 penetrates through all of these layers whereupon the electrode 100 is electrically connected with the transparent electrically conductive layer 60 and earthed by contacting such an electrically conductive screw of the PDP.

Figure 4:
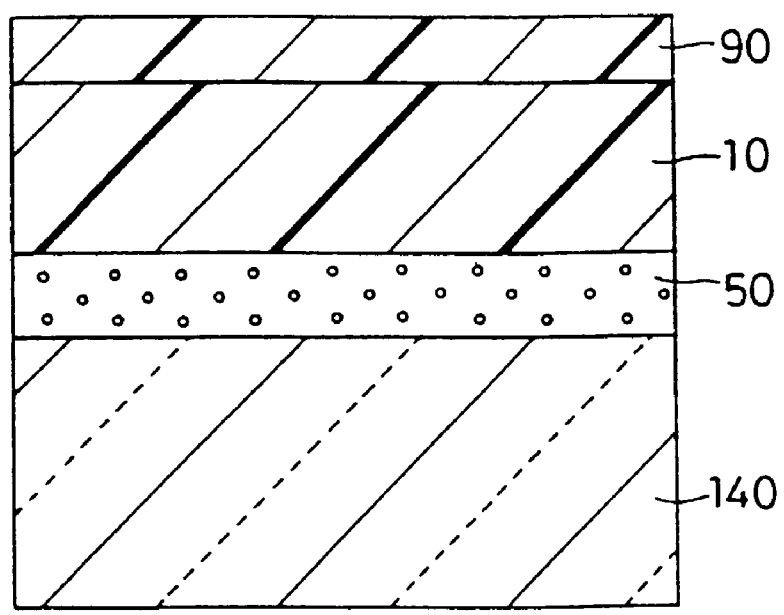
FIG. 4 is a cross-sectional view illustrating an example of a state when a laminate according to the invention is provided on an OELD.

Further, FIG. 4 shows a cross-section illustrating an example of a state in which a laminate according to the invention is provided on an OELD (organic electroluminescence display). As seen in FIG. 4, on the OELD 140, laminated are a transparent adhesive layer 50 characterized by low elasticity, a transparent polymer film 10 and an anti-reflection layer 90 in order of precedence.

Evaluation results are shown in Table 4.

It is demonstrated that, even when a number of the polymer film constituting the optical filter is one, the PDP provided with the optical filter can obtain a sufficient impact resistance by using a transparent adhesive layer having a lower Young's modulus than that ordinarily used.

TABLE 4

| Young's modulus (Pa) | Impact resistance test | Comprehensive evaluation |
| --- | --- | --- |
| 1,000 | Passed | Very good |

EXAMPLE 4

The same procedures as in Example 1 are repeated except for the item described below.

The same procedures as in Example 3 are repeated except that the silicone type adhesive (sample No. c) used in Example 2 is used as an adhesive characterized by low elasticity.

Evaluation results are shown in Table 5.

It is demonstrated that, even when the silicone type adhesive is used as a transparent adhesive layer, a sufficient impact resistance can be obtained in the same manner as in Example 3 in which an acrylic adhesive is used.

TABLE 5

| Young's modulus (Pa) | Impact resistance test | Comprehensive evaluation |
| --- | --- | --- |
| 30,000 | Passed | Very good |

EXAMPLE 5

The same procedures as in Example 1 are repeated except for the item described below.

An anti-reflection film is prepared in the same manner as in Example 3.

An acrylic adhesive (sample No. d) is prepared and, then, an adhesive layer is formed in the same manner as in Example 1.

Such a transparent adhesive layer as obtained in the above is formed on a PET film of anti-reflection film/a PET film. First of all, one of two mold releasing films which have each been bonded to both surfaces of the transparent adhesive layer is peeled off and, then, the resultant transparent adhesive layer is bonded on a transparent laminate to prepare another laminate. A composition of the resultant laminate comprises an anti-reflection film/a PET film/an adhesive/a mold releasing film.

The resultant optical filter is cut into a size of 60 mm×40 mm to prepare an optical filter.

Further, the optical filter is deprived of a mold releasing film and bonded to a front surface of a 3-inch type organic electroluminescence display (representation portion: 60 mm×40 mm).

A judgment of acceptance in the impact resistance test is made on the basis of breakage of a glass substrate of a display viewing surface.

Evaluation results are shown in Table 6.

It is demonstrated that, by lowering the Young's modulus of a transparent adhesive layer than that of a conventional one, a small-sized portable display provided with the transparent adhesive layer is less liable to breakage to be caused by impact generated by being dropped.

TABLE 6

| Young's modulus (Pa) | Impact resistance test | Comprehensive evaluation |
| --- | --- | --- |
| 1,000 | Passed | Very good |

EXAMPLE 6

The same procedures as in Example 1 are repeated except for the item described below.

The same procedures as in Example 5 are repeated except that the silicone type adhesive (sample No. c) used in Example 2 is used as an adhesive characterized by low elasticity.

Evaluation results are shown in Table 7.

It is demonstrated that, even when the silicone type adhesive is used as a transparent adhesive layer, impact resistance of the small-sized portable display provided with the transparent adhesive layer can be enhanced in the same manner as in a case in which an acrylic adhesive is used.

TABLE 7

| Young's modulus (Pa) | Impact resistance test | Comprehensive evaluation |
| --- | --- | --- |
| 30,000 | Passed | Very good |

EXAMPLE 7

The same procedures as in Example 1 were repeated except for the items described below.

In the preparation of acrylic adhesive, a sample c is prepared.

In the formation of adhesive, seven adhesive layers are prepared in different thicknesses of 510, 500, 300, 100, 50, 10 and 5 µm.

In the formation of adhesive layer on transparent electrically conductive film, the thus-prepared seven adhesive layers are each bonded on the PET film surface of the transparent electrically conductive film/PET film to prepare seven laminates. A composition thereof comprises a transparent electrically conductive film/a PET film/an adhesive/a mold releasing film.

In (Preparation of Optical Filter);

After the optical filter is prepared, luminous average transmittance (Tvis) thereof is measured. When the luminous average transmittance is lower than 30%, the optical filter is judged as unpractical.

Evaluation results are shown in Table 8.

When the thickness of the adhesive layer is smaller than 10 µm, it is demonstrated that the optical filter does not pass the impact resistance test. Further, when the thickness of the adhesive layer is larger than 500 µm, the luminous average transmittance (Tvis) thereof becomes less than 30% whereupon it is demonstrated that the optical filter in this case is not practical.

Under these circumstances, it is demonstrated that the thickness of the adhesive layer is preferably in a range of from 0 to 500 µm.

TABLE 8

| Thickness of adhesive layer (μm) | Impact resistance test | Tvis (%) |
|---|---|---|
| 510 | Passed | 29 |
| 500 | Passed | 30 |
| 300 | Passed | 55 |
| 100 | Passed | 60 |
| 50 | Passed | 70 |
| 10 | Passed | 73 |
| 5 | Not passed | 75 |

With regard to the Young's modulus of the transparent resin layer

EXAMPLE 8

(Preparation of Transparent Resin Layer)

Polyethylene terephthalate pellets 1203 (manufactured by Unitika, Ltd.) are melted at from 290 to 300° C. and extruded by an extruder to prepare a film having a thickness of 200 μm. Thereafter, thus-prepared film is biaxially stretched to prepare a PET film having a thickness of 100 μm.

Preparation of the optical filter and bonding it to a front surface of the PDP are performed in the same manner as in Example 1 except that the PET film described above and a transparent adhesive sheet (thickness: 0.01 mm; Young's modulus: 2.5 MPa) manufactured by Tomoegawa Paper Co., Ltd. are used.

Figure 5:
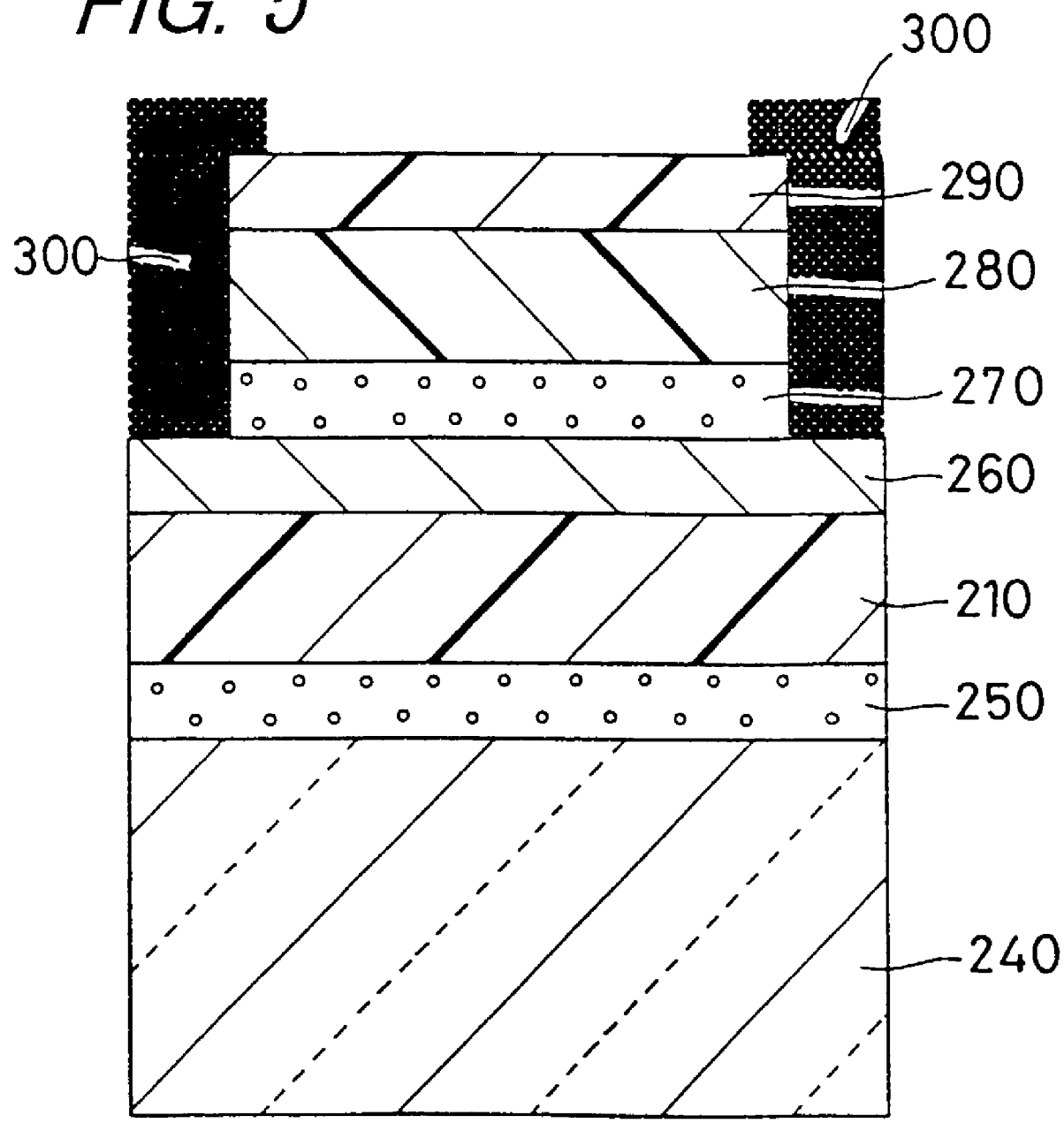
FIG. 5 is a cross-sectional view illustrating still another example of a state when a laminate according to the invention is provided on a PDP.

A cross-section of the optical filter is shown in FIG. 5 as a cross-section illustrating another example of the optical filter according to the invention and a provided state thereof. As seen in FIG. 5, on a plasma display panel 240, laminated are a transparent adhesive layer 250, a transparent resin layer 210 having appropriate elasticity and thickness, an electrically conductive layer 260, a transparent adhesive layer 270, a transparent resin layer 280 and an anti-reflection layer 290 in order of precedence. An electrode 300 is electrically connected to the transparent electrically conductive layer 260 such that the electrode 300 covers edges of the transparent adhesive layer 270, the transparent resin layer 280 and the anti-reflection layer 290.

(Impact Resistance Test)

Impact resistance of a PDP provided with the optical filter prepared in a manner as described above is examined by a steel ball drop test. Relative merits are judged in accordance with a distance which scattered glass reaches. Namely, it is judged that, as the glass is scattered farther, performance of the optical filter provided to the PDP is lower. When such a flying distance of the scattered glass according to the invention is within 0.5 m, it is considered that the transparent resin layer functions effectively.

EXAMPLE 9

The same procedures as in Example 8 are repeated except that PET of a transparent resin layer is not stretched.

EXAMPLE 10

The same procedures as in Example 8 are repeated except that an ethylene/propylene copolymer (thickness: 100 μm; Young's modulus in a direction perpendicular to a surface: 40 MPa) is used as a transparent resin layer characterized by elasticity.

EXAMPLE 11

The same procedures as in Example 8 are repeated except that an ethylene/vinyl acetate copolymer (EVA) (thickness: 100 μm; Young's modulus in a direction perpendicular to a surface: 12 MPa) is used as a transparent resin layer characterized by elasticity.

EXAMPLE 12

The same procedures as in Example 8 are repeated except that EVA (thickness: 100 μm; Young's modulus in a direction perpendicular to a surface: 4 MPa) is used as a transparent resin layer characterized by elasticity.

EXAMPLE 13

The same procedures as in Example 8 are repeated except that EVA (thickness: 200 μm; Young's modulus in a direction perpendicular to a surface: 12 MPa) is used as a base film to prepare an anti-reflection film. A transparent electrically conductive film is prepared in the same manner as in Example 8 on a surface of the thus-prepared anti-reflection film reverse to a surface on which an anti-reflection layer is formed.

An acrylic adhesive is prepared in a same manner as in Example 8 and a dye is dispersed in the thus-prepared acrylic adhesive to form an adhesive layer.

On a transparent electrically conductive film of an anti-reflection film/a PET film/a transparent electrically conductive film, formed is such a transparent adhesive layer as obtained in the above. First of all, one of two mold releasing films which have each been bonded to both sides of the transparent adhesive layer is peeled off and, then, the resultant transparent adhesive layer is bonded on a transparent laminate to form an optical filter. A composition of the resultant optical filter comprises an anti-reflection film/a PET film/a transparent electrically conductive film/an adhesive/a mold releasing film.

The resultant laminate is cut into a size of 970 mm×570 mm to prepare an optical filter.

Further, the optical filter is deprived of a mold releasing film and bonded to a front surface of a 42-inch type plasma display panel (representation portion: 920 mm×520 mm) by a sheet-feeding type laminator.

Further, a hole is previously provided on the periphery of a representation portion of a front surface of a plasma display panel for fastening it with an exterior part by a screw. Such a screw hole has electric conduction with the exterior part off the PDP and is allowed to be earthed.

Figure 6:
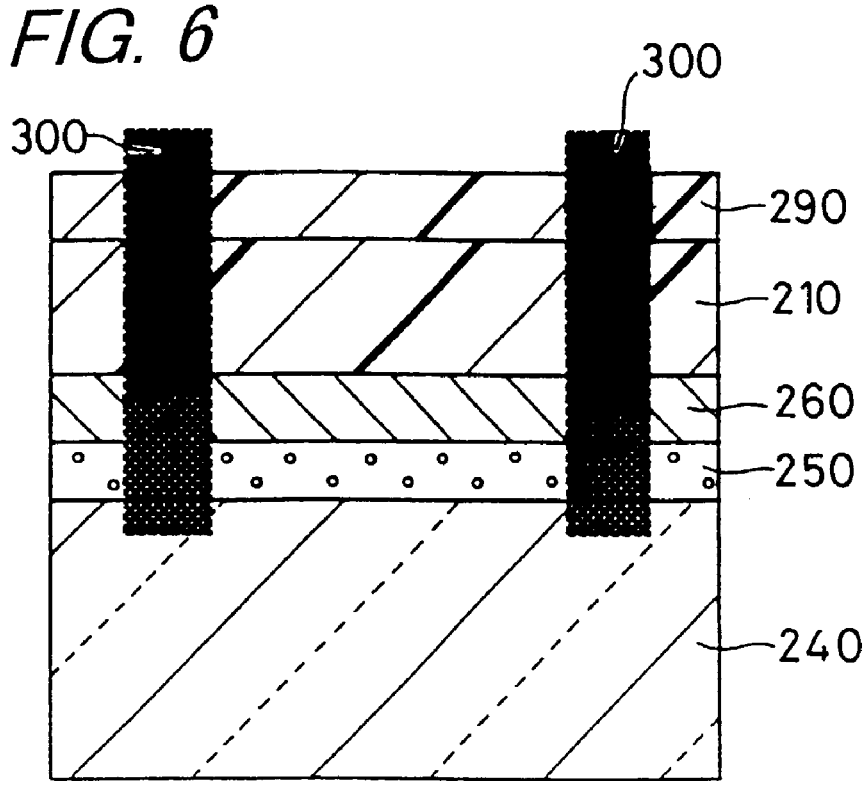
FIG. 6 is a cross-sectional view illustrating still another example of a state when a laminate according to the invention is provided on a PDP.

The optical filter is bonded to the PDP such that the optical filter covers the screw hole. The screw is fixed in the screw hole such that it penetrates from a surface of the optical filter through the whole body thereof. It is necessary that the screw to be used has electric conductivity. A cross-section of the optical filter is shown in FIG. 6 as a cross-section illustrating still another example of the optical filter according to the invention and a provided state thereof. As seen in FIG. 6, on the plasma display panel 240, laminated are a transparent adhesive layer 250, a transparent electrically conductive layer 260, a transparent resin layer 210, and an anti-reflection layer 290 in order of precedence. An electrode 300 is provided such that the electrode 300 penetrates through all of these layers whereupon the electrode 300 is electrically connected with the transparent electrically conductive layer 260 and earthed by contacting such an electrically conductive screw of the PDP.

EXAMPLE 14

The same procedures as in Example 13 are repeated except that EVA (thickness: 200 μm; Young's modulus in a direction perpendicular to a surface: 4 MPa) is used as a transparent resin layer characterized by elasticity.

Evaluation results are shown in Table 9. The term "constituting layer number" used in Table 9 is intended to include a total number of transparent resin layers constituting the laminate. The term "scattered distance" of glass used in Table 9 is intended to refer to a result after the steel ball drop test is performed.

TABLE 9

| Example | Transparent resin | Young's modulus (MPa) | Constituting layer number | Scattered distance (m) |
|---|---|---|---|---|
| 8 | PET | 1,000 | 2 | 3.3 |
| 9 | PET | 90 | 2 | 0.5 |
| 10 | EPR | 40 | 2 | 0.1 |
| 11 | EVA | 12 | 2 | 0.1 |
| 12 | EVA | 4 | 2 | 0.1 |
| 13 | EVA | 12 | 1 | 0.1 |
| 14 | EVA | 4 | 1 | 0.1 |

EPR: ethylene/propylene copolymer
EVA: ethylene/vinyl acetate copolymer

EXAMPLE 15

Such a filter sheet as in Example 10 was cut to a size of 40 mm×30 mm and bonded on a viewing surface of a 2-inch type organic electroluminescence element (size: 40 mm×30 mm).

Figure 7:
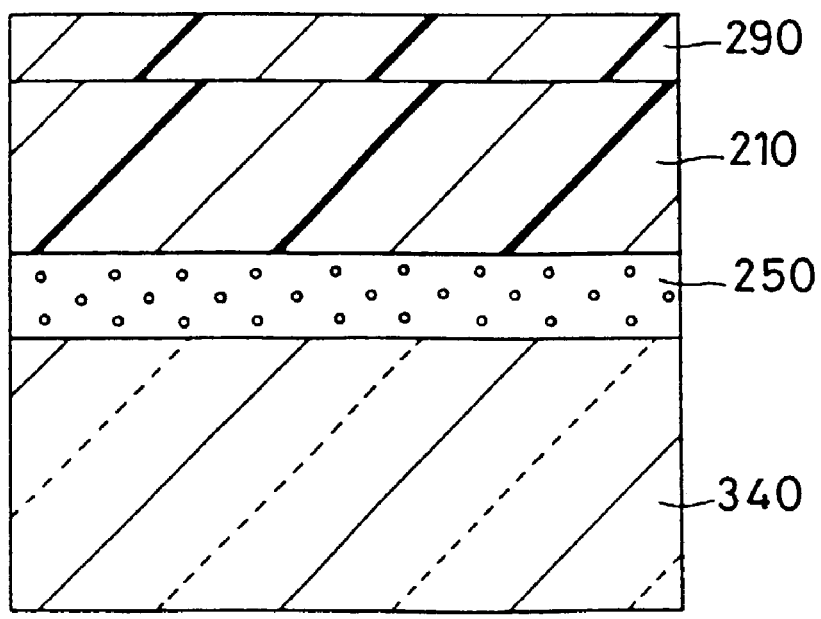
FIG. 7 is a cross-sectional view illustrating another example of a state when a laminate according to the invention is provided on an OELD.

Further, FIG. 7 shows a cross-section illustrating another example of a state in which a laminate according to the invention is provided on an OELD (organic electroluminescence display). As seen in FIG. 7, on the OELD 340, laminated are a transparent adhesive layer 250, a transparent resin layer 210 and an anti-reflection layer 290 in order of precedence.

Impact resistance of this element is examined by a drop test. According to the invention, when a scattered distance of glass is within 0.5 m, it is considered that impact resistance function is sufficiently exerted.

EXAMPLE 16

Same procedures as in Example 15 are repeated except that such a PET film prepared in Example 14 is used.

Evaluation results are shown in Table 10. The term "material" used in Table 10 is intended to include a material of a transparent resin layer characterized by elasticity and thickness. The term "Young's modulus" used in Table 10 is intended to include a Young's modulus in a direction perpendicular to a surface of the transparent resin layer. The term "scattered distance" of glass used in Table 10 is intended to refer to a result after a drop test is performed.

TABLE 10

| Example | Transparent resin | Young's modulus (MPa) | Scattered distance (m) |
|---|---|---|---|
| 15 | EPR | 40 | 0.4 |
| 16 | EVA | 4 | 0.2 |

Next, a case in which an impact absorption layer is used is described.

EXAMPLE 17

(Preparation of Transparent Electrically Conductive Layer)

A transparent electrically conductive layer is prepared in the same manner as in Example 1 except that a PET film (thickness: 75 μm; Young's modulus: 3,900 MPa) and a transparent adhesive sheet (thickness: 0.01 mm; Young's modulus: 2.5 MPa) manufactured by Tomoegawa Paper Co., Ltd. are used.

(Preparation of Impact Absorption Layer)

A silicone substance in a gel state (available from Geltec Co., Ltd.; trade name: αGEL; thickness: 500 μm in sheet form; luminous average transmittance: 83%; penetration: 180) is prepared and, then, an anti-reflection layer is formed on one major surface thereof in the same manner as in a case in which the anti-reflection film is prepared in the above. Further, a transparent adhesive (thickness: 25 μm; Young's modulus: 2.0 MPa) is bonded on the other major surface thereof.

An optical filter is prepared and, then, bonded to the PDP in the same manner as in Example 1 except that the transparent electrically conductive film described above and an impact absorption layer are used.

Figure 8:
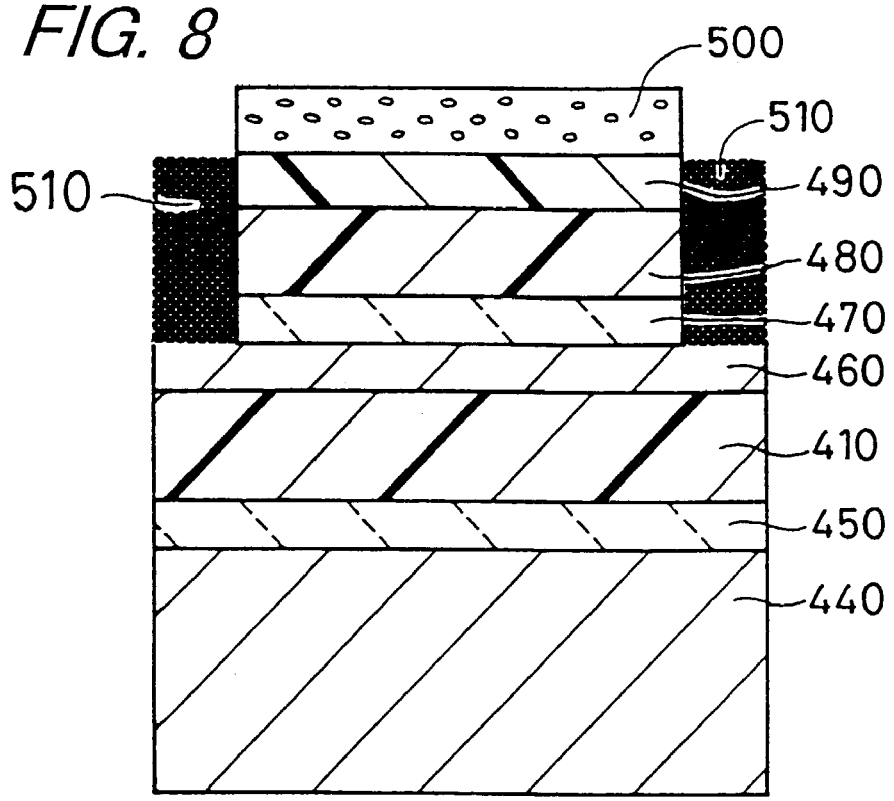
FIG. 8 is a cross-sectional view illustrating still another example of a state when a laminate according to the invention is provided on a PDP.

FIG. 8 shows a cross-sectional diagram illustrating further another example of an optical filter according to the invention and a provided state thereof. As seen in FIG. 8, on a plasma display panel 440, laminated are a transparent adhesive layer 450, a transparent resin layer 410, a transparent electrically conductive layer 460, a transparent adhesive layer 470, a transparent resin layer 480, an anti-reflection layer 490, an impact absorption layer 500 in order of precedence. An electrode 510 is electrically connected to the transparent electrically conductive layer 460 such that the electrode 510 covers edges of the transparent adhesive layer 470, the transparent resin layer 480 and the anti-reflection layer 490.

(Impact Resistance Test)

An impact resistance of a PDP provided with such an optical filter as is prepared in the above is examined by a steel ball drop test.

EXAMPLE 18

Same procedures as in Example 17 were repeated except for items described below.

In (Preparation of Impact Absorption Layer);

A silicone substance in a gel state (available from Geltec Co., Ltd.; trade name: αGEL; thickness: 500 μm in sheet form; penetration: 180; luminous average transmittance: 83%) is prepared and, then, a transparent adhesive (thickness: 25 μm; Young's modulus: 2.0 MPa) is bonded on a major surface thereof.

In (Preparation of Optical Filter);

An optical filter is obtained by bonding the adhesive layer containing a dye of the optical filter in Example 1 and a surface, on which a transparent adhesive layer is not formed, of the thus-obtained impact absorption layer with each other.

A composition to be obtained comprises an anti-reflection layer/a TAC film/a transparent adhesive layer/a transparent electrically conductive layer/an adhesive layer containing a dye/an impact absorption layer/an adhesive layer/a separator film.

Further, a silver paste (MSP-600F; manufactured by Mitsui Chemicals, Inc.) is screen-printed to an area of 22 mm wide of a peripheral portion of a transparent electrically conductive layer such that the silver paste covers an exposed electrically conduction portion of the transparent electrically conductive layer and, then, dried to form an electrode of 15 μm thick.

Figure 9:
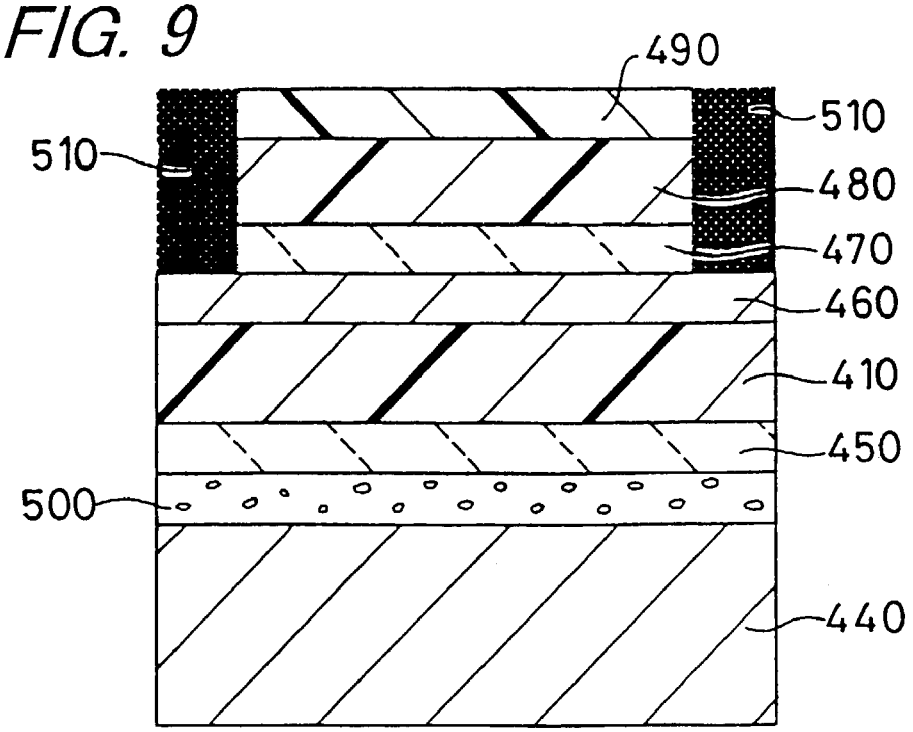
FIG. 9 is a cross-sectional view illustrating still another example of a state when a laminate according to the invention is provided on a PDP.

In (Provision of Optical Filter);

A cross-sectional diagram of a PDP provided with an optical filter along with a cross-sectional diagram of the optical filter are shown in FIG. 9. As seen in FIG. 9, on a plasma display panel 440, laminated are an impact absorption layer 500, a transparent adhesive layer 450, a transparent resin layer 410, a transparent electrically conductive layer 460, a transparent adhesive layer 470, a transparent resin layer 480 and an anti-reflection layer 490 in order of precedence. An electrode 510 is electrically connected to the transparent electrically conductive layer 460 such that the electrode 510 covers edges of the transparent adhesive layer 470, the transparent resin layer 480 and the anti-reflection layer 490.

EXAMPLE 19

Same procedures as in Example 17 were repeated except for items described below.

Two kinds of impact absorption layers were prepared.

In (Preparation of Impact Absorption Layer I)

A silicone substance in a gel state (available from Geltec Co., Ltd.; trade name: αGEL; thickness: 500 μm in sheet form; luminous average transmittance: 83%; penetration: 180) is prepared and, then, an anti-reflection layer is formed on one major surface thereof in the same manner as in a case in which the anti-reflection film is prepared in the above. Further, a transparent adhesive (thickness: 25 μm; Young's modulus: 2.0 MPa) is bonded on the other major surface thereof, The resultant layer is designated as an impact absorption layer I.

In (Preparation of Impact Absorption Layer II)

A silicone substance in a gel state (available from Geltec Co., Ltd.; trade name: αGEL; thickness: 500 μm in sheet form; luminous average transmittance: 83%; penetration: 180) is prepared and, then, a transparent adhesive (thickness: 25 μm; Young's modulus: 2.0 MPa) is bonded on one major surface thereof. The resultant layer is designated as an impact absorption layer II.

In (Preparation of Optical Filter);

An optical filter is obtained by bonding the adhesive layer containing a dye of the optical filter in Example 1 and a surface, on which a transparent adhesive layer is not formed, of the thus-obtained impact absorption layer II with each other.

A composition of a laminate to be obtained comprises an anti-reflection layer/a TAC film/a transparent adhesive layer/a transparent electrically conductive layer/an adhesive layer containing a dye/an impact absorption layer/an adhesive layer/a separator film.

Further, a silver paste (MSP-600F; manufactured by Mitsui Chemicals, Inc.) is screen-printed to an area of 22 mm wide of a peripheral portion of a transparent electrically conductive layer such that the silver paste covers an exposed electrically conduction portion of the transparent electrically conductive layer and, then, dried to form an electrode of 15 μm thick.

A transparent adhesive side of the impact absorption layer I and an anti-reflection film side of the laminate are bonded together.

Subsequently, the laminate is removed from a supporting plate and, then, an optical filter having a mold releasing film according to the invention is prepared on a transparent adhesive layer side of the resultant laminate.

Figure 10:
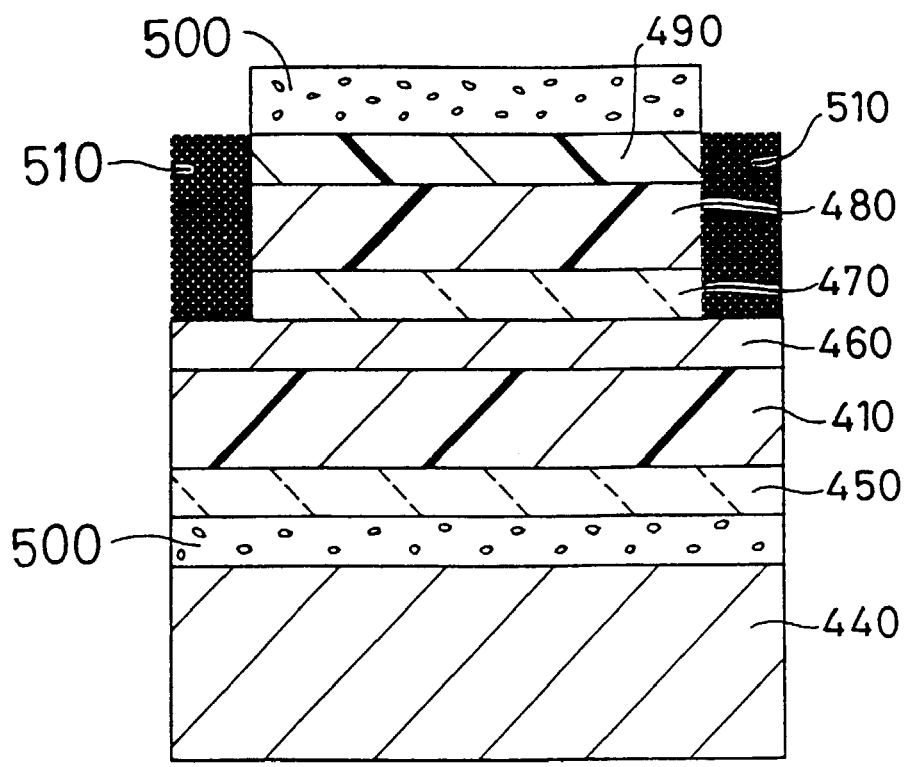
FIG. 10 is a cross-sectional view illustrating still another example of a state when a laminate according to the invention is provided on a PDP.

A cross-sectional diagram of a PDP provided with the optical filter along with a cross-sectional diagram of the optical filter are shown in FIG. 10. As seen in FIG. 10, on a plasma display panel 440, laminated are an impact absorption layer 500, a transparent adhesive layer 450, a transparent resin layer 410, a transparent electrically conductive layer 460, a transparent adhesive layer 470, a transparent resin layer 480, an anti-reflection layer 490 and an impact absorption layer 500 in order of precedence. An electrode 510 is electrically connected to the transparent electrically conductive layer 460 such that the electrode 510 covers edges of the transparent adhesive layer 470, the transparent resin layer 480 and the anti-reflection layer 490.

EXAMPLE 20

Same preparation and evaluation as in Example 17 were repeated except that none of an anti-reflection film and an impact absorption layer II was used.

COMPARATIVE EXAMPLE 2

Same procedures as in Example 17 were repeated except that an impact absorption layer is not formed.

The results of Examples 17 to 20 and Comparative Example 2 are shown in Table 11.

TABLE 11

| Example | Impact absorption layer | Absorption layer number | Impact Absorption layer position | Filter-constituting member | Impact resistance test |
|---|---|---|---|---|---|
| 17 | Silicone gel | 1 | Viewing surface side | Transparent electrically conductive film + Anti-reflection film | Passed |
| 18 | Silicone gel | 1 | Panel surface side | Transparent electrically conductive film + Anti-reflection film | Passed |
| 19 | Silicone gel | 2 | Both sides | Transparent electrically conductive film + Anti-reflection film | Passed |
| 20 | Silicone gel | 1 | Viewing surface side | Transparent electrically conductive film | Passed |
| Comparative Example 2 | No | | | | Not passed |

As understood from the results of Examples 17 to 20 in Table 11, it is demonstrated that a plasma display panel which passes the impact test can be obtained in all of these Examples.

As shown in Comparative Example 2, the plasma display panel provided with an optical filter which uses a laminate that is not provided with an impact absorption layer does not pass the impact resistance test.

EXAMPLE 21

(Preparation of Anti-Reflection Film)

An anti-reflection layer was formed on a PET film (thickness:188 μm; Young's modulus: 4,000 MPa) in the same manner as in Example 1, and an adhesive layer (thickness: 25 μm; Young's modulus: 2.0 MPa) was formed on a reverse surface. A composition comprises an anti-reflection layer/a PET film/an adhesive layer.

(Preparation of Impact Absorption Layer)

A silicone substance in a gel state (available from Geltec Co., Ltd.; trade name: αGEL; thickness: 500 μm in sheet form; luminous average transmittance: 83%; penetration: 180) is prepared and, then, an anti-reflection layer is formed on one major surface thereof in the same manner as in a case in which the anti-reflection film is prepared in the above. Further, a transparent adhesive (thickness: 25 μm; Young's modulus: 2.0 MPa) is bonded on the other major surface thereof.

(Preparation of Optical Filter)

The anti-reflection film cut in a size of 40 mm×30 mm and an impact absorption layer are bonded with each other. A composition comprises an anti-reflection layer/a PET film/ an adhesive layer/an impact absorption layer/an adhesive layer/a separator.

The resultant optical filter is bonded on a screen of a 2-inch organic electroluminescence element (size: 40 mm×30 mm).

Figure 11:
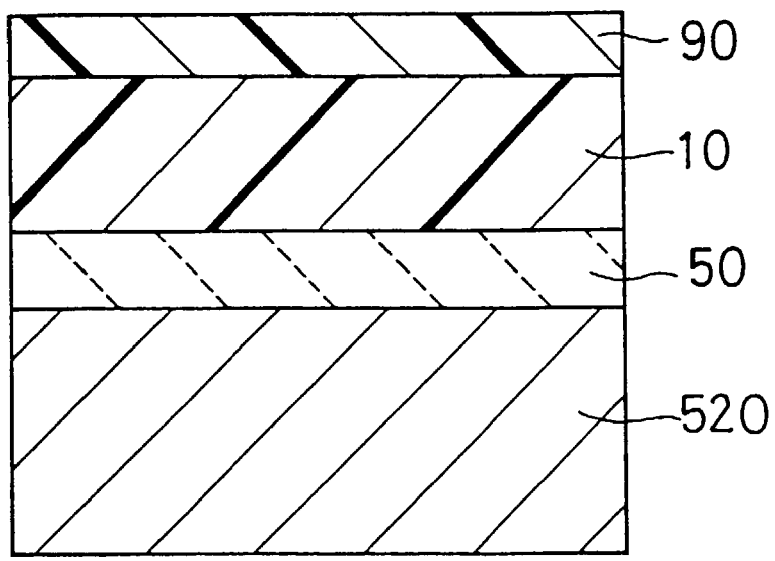
FIG. 11 is a cross-sectional view illustrating still another example of a state when a laminate according to the invention is provided on an OELD.

A cross-sectional diagram of an organic electroluminescence element provided with the anti-reflection film along with a cross-sectional diagram of the anti-reflection film are shown in FIG. 11. As seen in FIG. 11, on an organic electroluminescence display 520, laminated are a transparent adhesive layer 50, a transparent resin layer 10 and an anti-reflection layer 90 in order of precedence.

Impact resistance of this element is examined by the drop test.

COMPARATIVE EXAMPLE 3

Same procedures as in Example 21 were repeated except that an impact absorption layer is not formed.

Results of Example 21 and Comparative Example 3 are shown in Table 12.

TABLE 12

| Example | Impact absorption layer | Absorption layer number | Impact absorption layer position | Impact resistance test |
|---|---|---|---|---|
| 21 | Silicone gel | 1 | Viewing surface side | Passed |
| Comparative Example 3 | No | | | Not passed |

As understood from the results of Example 21 shown in Table 12, it is demonstrated that, by using an optical filter provided with an impact absorption layer, an organic electroluminescence element which passes the impact resistance test can be obtained. Further, as shown in Comparative Example 3, an organic electroluminescence element which is provided with a laminate or an optical filter that is not provided with an impact absorption layer does not pass the impact resistance test.

Next, a case in which an evaluation by a ball drop impact test is executed is described.

EXAMPLE 22

(Preparation of Transparent Electrically Conductive Film)

Designating a polyethylene terephthalate (hereinafter referred to also as PET) film (width: 564 mm; length: 500 m; thickness: 75 μm; Young's modulus: 3,900 MPa) as a polymer film, a transparent electrically conductive layer comprising 7 layers in total made up of an ITO thin film (40 nm thick), a silver thin film (10 nm thick), an ITO thin film (95 nm thick), a silver thin film (12 nm thick), an ITO thin film (90 nm thick), a silver thin film (9 nm thick) and an ITO thin film (40 nm thick) in order of precedence as viewed from a side of the PET film was formed on one major surface of the PET film to prepare a transparent electrically conductive film comprising a transparent electrically conductive layer having a surface resistance of 2.3 Ω/square in the same manner as in Example 1. A transparent adhesive layer was formed in an opposite side of the transparent electrically conductive layer. A cross-sectional diagram is shown in FIG. 1.

(Preparation of AG Film)

An AG film (manufactured by NOF Corporation; trade name: PET75AG-HC/PU-V; a transparent adhesive layer being formed in an opposite side of an AG layer; width 558 mm; length: 500 m; thickness: 75 μm)(base layer: PET film; Young's modulus: 3,900 MPa) is prepared.

(Preparation of EVA Sheet)

Pellets of ethylene-vinyl acetate copolymer (manufactured by DuPont-Mitsui Polychemicals Co., Ltd.; content of vinyl acetate unit: 19 wt %; MFR=2.5 g/10 minutes; JIS-A hardness=89; Young's modulus: 43 MPa) are subjected to injection molding processing to prepare sheets each having a size of 564 mm wide and each of 0.23 mm thick, 0.36 mm thick, 0.93 mm thick, 1.3 mm thick and 2.1 mm thick. On one surface of each of the thus-prepared sheets, a transparent adhesive layer (containing no dye; thickness: 0.01 mm) is bonded.

(Bonding)

An adhesive layer side of the transparent electrically conductive film prepared in the above and a side opposite to an adhesive layer of an EVA sheet having a thickness of 2.1 mm are bonded with each other by a roll-to-roll method.

A transparent electrically conductive layer side of the laminate prepared in the above and an adhesive layer side of the AG film are bonded together by a roll-to-roll method. Further, in regard to positions of the films in a width direction, the films are positioned such that center positions thereof are allowed to meet with each other. A whole thickness is 2.3 mm.

(Cutting)

The laminate described above is cut to be a size of 958 mm*564 mm.

(Electrode Formation)

A silver paste is applied on a long side of the laminate in a width of 6 mm by a screen-printing method and, then, dried to obtain a filter 1 for a display. Such an application was performed on an AG film side.

(Provision to Plasma Display Panel)

A filter for a display was provided on a front surface of a plasma display panel (manufactured by NEC Corporation, PX-42VP1) via a transparent adhesive layer containing a dye. A contact previously provided on the plasma display panel is connected to an electrode portion of the filter for the display. A whole electrode which has been provided along a whole peripheral portion thereof is allowed to be covered.

(Evaluation of Electromagnetic Wave Shielding Capacity)

A plasma display panel is actuated to measure an intensity of an electromagnetic wave which is emitted outside based on FCC specifications Part 15J. This filter satisfies a class A standard.

(Ball Drop Impact Test)

A compression type load cell (rated capacity: 20 kN; rated output: $1160*10^{-6}$ strain) (LC-20KNG702; available from Nikkei Electronic Instruments Co., Ltd.) is fixed on a stone table and, then, a sample having a size of 50 mm*50 mm cut out of the filter described above is fixed on a center portion of the load cell and, thereafter, a steel ball having a weight of 543 g is dropped from a height of 10 cm at room temperature. On this occasion, stress and time are measured by using the load cell, a dynamic strain meter (AS2102; available from NEC San-ei Instruments, Ltd.), a high-speed DC amplifier (AP11-103; available from NEC San-ei Instruments, Ltd.) and a thermal dot recorder (RA1200; available from NEC San-ei Instruments, Ltd.) after they are connected with one another. The results are shown in Table 1.

Further, the same sample film is fixed on a plasma display panel (PX-42VPI; available from NEC Corporation) and, then, when a steel ball having a weight of 543 g is dropped from a height of 10 cm, the PDP panel is not broken.

EXAMPLE 23

A sample sheet is prepared and a ball drop impact test is conducted in the same manner as in Example 22 except that αGEL under the trade name (silicone type gel available from Geltec Co., Ltd.; thickness: 3 mm; one surface being applied with transparent adhesive) is used instead of an EVA sheet. The results are shown in Table 13.

COMPARATIVE EXAMPLE 4

A sample sheet is prepared and a ball drop impact test is conducted in the same manner as in Example 22 except that a PET sheet (thickness: 2 mm; Young's modulus: 900 MPa) is used instead of EVA and αGEL. The results are shown in Table 13.

EXAMPLE 25

(Preparation of Styrene Type Thermoplastic Elastomer (SEBS) Sheet)

Pellets of styrene type thermoplastic elastomer manufactured by Shell Chemical Co. (trade name: KRATON G1657; JIS-A hardness: 55; Young's modulus: 1.2 MPa) are subjected to injection molding processing to prepare sheets each having a size of 564 mm wide and each of 0.36 mm thick, 0.54 mm thick and 1.02 mm thick. On one surface of each of the thus-prepared sheets, a transparent adhesive layer (containing no dye; thickness: 0.01 mm) is bonded.

(Bonding, and Ball Drop Impact Test)

Bonding and a ball drop impact test were conducted in the same manner as in Example 24 except that an EVA sheet having a thickness of 0.36 mm and αGEL having a thickness of 1 mm were used. The results are shown in Table 14.

EXAMPLE 26

A sample sheet was prepared and a ball drop impact test was conducted in the same manner as in Example 12 except that thickness of an EVA sheet is allowed to be 0.23 mm and size thereof to be 50 mm in each of length and width and an electrode printing has not been conducted. The results are shown in Table 14.

EXAMPLE 27

A sample sheet was prepared and a ball drop impact test was conducted in the same manner as in Example 23 except that thickness of an EVA sheet is allowed to be 0.93 mm, αGEL under the trade name (silicone type gel available from Geltec Co., Ltd.; size: 50 mm*50 mm*0.3 mm; a transparent adhesive being applied on one surface; JIS-A hardness<10) was used instead of an SEBS sheet. The results are shown in Table 14.

EXAMPLE 28

A sample sheet was prepared and a ball drop impact test was conducted in the same manner as in Example 24 except

TABLE 13

| Example | Sheet 1 Name | Sheet 1 Thickness/mm | Sheet 2 Name | Sheet 2 Thickness/mm | T/F | Breakage of PDP panel | Electromagnetic wave shielding effect |
|---|---|---|---|---|---|---|---|
| 22 | EVA | 2.1 | — | — | 254 | No | Class A |
| 23 | αGEL | 3.0 | — | — | 1240 | No | Not conducted |
| Comparative Example 4 | PET | 2.0 | — | — | 65 | Yes | Class A |

Next, an evaluation conducted by a ball drop impact test on a laminate comprising at least two layers having different JIS-A hardness from one another is described.

EXAMPLE 24

A ball drop impact test is conducted in the same manner as in Example 22 except that a sample sheet is used which is prepared by bonding αGEL having a thickness of 1 mm, EVA having a thickness of 0.23 mm and a laminate with one another. The results are shown in Table 15.

that thickness of an EVA sheet is allowed to be 0.23 mm and thickness of αGEL is allowed to be 1 mm. The results are shown in Table 14.

EXAMPLE 29

A sample sheet was prepared and a ball drop impact test was conducted in the same manner as in Example 24 except that thickness of an EVA sheet is allowed to be 0.36 mm and thickness of αGEL is allowed to be 1 mm. The results are shown in Table 14.

EXAMPLE 30

A sample sheet was prepared and a ball drop impact test was conducted in the same manner as in Example 26 except that an SEBS sheet (thickness: 0.36 mm) was used instead of an EVA sheet. The results are shown in Table 14.

EXAMPLE 31

A sample sheet was prepared and a ball drop impact test was conducted in the same manner as in Example 27 except that thickness of an SEBS sheet is allowed to be 0.93 mm and thickness of αGEL is allowed to be 0.3 mm. The results are shown in Table 14.

EXAMPLE 32

(Preparation of EVA/Ethylene Propylene Terpolymer (EPT) Co-Crosslinked Sheet)

40 parts of EVA, 60 parts by weight of Mitsui EPT (ethylene/propylene/ethylidene norbornene copolymer), 25 parts by weight of silica, 27 parts by weight of paraffin oil and additives such as a stabilizer, a silane coupling agent, a peroxide and a stabilizer are kneaded and, then, subjected to melt-press forming to obtain sheets in a size of 150 mm long, 150 mm wide and each of 0.54 mm thick and 1.17 mm thick (hereinafter referred to also as EVT; JIS-A hardness: 64; Young's modulus: 1.2 MPa). JIS-A hardness of these sheets are both 64. On one surface of each of these sheets, bonded is the adhesive (dye; not contained: thickness: 0.01 mm) described above.

(Ball Drop Impact Test)

A sample sheet was prepared and a ball drop impact test was conducted in the same manner as in Example 28 except that EVT having a thickness of 1.17 mm was used instead of SEBS. The results are shown in Table 14.

EXAMPLE 33

A sample sheet was prepared and a ball drop impact test was conducted in the same manner as in Example 29 except that thickness of EVT was allowed to be 0.54 mm and αGEL (silicone type gel available from Geltec Co., Ltd.; size: 50 mm*50 mm*0.5 mm; a transparent adhesive being applied on one surface; JIS-A hardness<10) was used. The results are shown in Table 14.

EXAMPLE 34

A sample sheet was prepared and a ball drop impact test was conducted in the same manner as in Example 30 except that SEBS having a thickness of 0.36 mm was used instead of αGEL. The results are shown in Table 14.

EXAMPLE 35

A sample sheet was prepared and a ball drop impact test was conducted in the same manner as in Example 31 except that thickness of SEBS was allowed to be 0.54 mm. The results are shown in Table 14.

TABLE 14

| Example | Layer 1 Name | Layer 1 Thickness (mm) | Layer 2 Name | Layer 2 Thickness (mm) | Impact alleviation layer thickness | T/F | Hardness ratio | Panel breakage | Electromagnetic wave shielding effect |
|---|---|---|---|---|---|---|---|---|---|
| 24 | αGEL | 1.0 | EVA | 0.23 | 1.23 | 260 | >8.9 | No | Not conducted |
| 25 | EVA | 0.36 | SEBS | 0.93 | 1.31 | 281 | 1.62 | No | Class A |
| 26 | EVA | 0.23 | SEBS | 0.93 | 1.18 | 255 | 1.62 | No | Not conducted |
| 27 | EVA | 0.94 | αGEL | 0.3 | 1.26 | 242 | >8.9 | No | Not conducted |
| 28 | EVA | 0.23 | αGEL | 1 | 1.24 | 258 | >8.9 | No | Not conducted |
| 29 | EVA | 0.36 | αGEL | 1 | 1.37 | 281 | >8.9 | No | Not conducted |
| 30 | SEBS | 0.36 | αGEL | 1 | 1.37 | 297 | >5.5 | No | Not conducted |
| 31 | SEBS | 0.93 | αGEL | 0.3 | 1.24 | 319 | >5.5 | No | Not conducted |
| 32 | EVT | 1.17 | αGEL | 0.3 | 1.48 | 316 | >6.4 | Yes | Not conducted |
| 33 | EVT | 0.54 | αGEL | 0.5 | 1.05 | 280 | >6.4 | No | Not conducted |
| 34 | EVT | 0.54 | SEBS | 0.36 | 0.92 | 243 | 1.16 | No | Not conducted |
| 35 | EVT | 0.54 | αGEL | 0.54 | 1.10 | 283 | 1.16 | No | Not conducted |
| Comparative Example 4 | PET | 2.0 | — | — | 2.0 | 65 | — | Yes | Class A |

EXAMPLE 36

A sample sheet was prepared and a ball drop impact test was conducted in the same manner as in Example 24 except that thickness of αGEL was allowed to be 0.5 mm and that of EVA was allowed to be 0.36 mm. The results are shown in Table 15.

EXAMPLE 37

A sample sheet was prepared and a ball drop impact test was conducted in the same manner as in Example 24 except that thickness of αGEL was allowed to be 0.5 mm and that of EVT was allowed to be 0.5 mm. The results are shown in Table 15.

EXAMPLE 38

A sample sheet was prepared and a ball drop impact test was conducted in the same manner as in Example 24 except that thickness of SEBS was allowed to be 0.45 mm and that of EVT was allowed to be 0.45 mm. The results are shown in Table 15.

TABLE 15

| | Layer 1 | | Layer 2 | | Impact alleviation | | | | |
|---|---|---|---|---|---|---|---|---|---|
| Example | Name | Thickness (mm) | Name | Thickness (mm) | layer thickness (mm) | T/F | Hardness ratio | Panel breakage | Electromagnetic wave shielding effect |
| 36 | αGEL | 0.5 | EVA | 0.36 | 0.86 | 260 | >8.9 | No | Not conducted |
| 37 | SEBS | 0.5 | αGEL | 0.5 | 1.0 | 263 | >5.5 | No | Not conducted |
| 38 | EVT | 0.45 | SEBS | 0.45 | 0.90 | 252 | 1.16 | No | Not conducted |
| Comparative Example 4 | PET | 2.0 | — | — | 2.0 | 65 | — | Yes | Class A |

From the above-obtained results, it is demonstrated that, when at least one layer of the impact alleviation layer is provided and the T/F value is 200 or more, panel breakage is not generated.

The invention may be embodied in other specific forms without departing from the spirit or essential characteristics thereof. The embodiments are therefore to be considered in all respects as illustrative and not restrictive, the scope of the invention being indicated by the appended claims rather than by the foregoing description and all changes which come within the meaning and the range of equivalency of the claims are therefore intended to be embraced therein.

INDUSTRIAL APPLICABILITY

As has been described in detail, according to the invention, cost reduction can be aimed for. Take, for example, a case in which a laminate is provided on a display viewing surface. Safety standards such as impact resistance and the like can easily be attained. As a result, a large-sized display apparatus or a display apparatus for a small-sized portable terminal having excellent impact resistance can be realized at a low cost.

What is claimed is:

1. A display filter provided on a display viewing surface, comprising:
a laminate comprising at least a transparent adhesive layer and a transparent resin layer and having a thickness of 3.5 mm or less, wherein the laminate satisfies the following relationship when tested by a ball drop impact test:

$$T/F \geq 200 (\mu s/kN)$$

in which T (μs) represents a period of time from a generation of impact stress to an appearance of a first peak, and F (kN) represents impact stress at the time of the first peak in a stress-time curve, for the ball drop impact test in which a steel ball having a weight in a range of from 530 g to 550 g is dropped on the laminate from a height of 10 cm;
wherein the transparent adhesive layer comprises at least one selected from the group consisting of a rubber adhesive, an acrylic adhesive, a silicone adhesive and a vinyl adhesive, and the transparent adhesive layer has a Young's modulus and a thickness of from $1 \times 10^2$ Pa to $1 \times 10^6$ Pa and from 10 μm to 500 μm, respectively; and
wherein the transparent resin layer comprises at least one selected from the group consisting of a polyester resin, a polypropylene resin, an ethylene vinyl acetate copolymer, polyethylene, polystyrene, polyurethane and a transparent elastomer, and the transparent resin layer has a thickness of from 10 μm to 3,000 μm.

2. The display filter of claim 1, wherein at least one of the transparent resin layers has a Young's modulus of from $1 \times 10^3$ Pa to $1 \times 10^8$ Pa.

3. The display filter of claim 1, comprising two or more transparent resin layers, of which two layers are in a relation that a ratio of JIS-A hardness between the two layers is 1.1 or more.

4. The display filter of claim 1, wherein the transparent resin layer has a JIS-A hardness of 55 to 98.

5. The display filter of claim 1, further comprising at least one impact absorption layer.

6. The display filter of claim 5, wherein at least one of the impact absorption layers has a penetration of from about 50 to 200 based on the JIS K 2207-1991-50 g load test.

7. The display filter of claim 5, further comprising at least two layers in total of the transparent resin layers and impact absorption layers, of which two layers are in a relation that a ratio of JIS-A hardness between the two layers is 1.1 or more.

8. The display filter of claim 5, wherein the impact absorption layer has a JIS-A hardness of 98 or less.

9. The display filter of claim 1, wherein the transparent resin layer comprises a transparent electrically conductive layer or a metallic mesh layer having a surface resistance of from 0.01 Ω/square to 30 Ω/square.

10. The display filter of claim 1, wherein the transparent resin layer has at least one function selected from the group consisting of an anti-reflection function, an anti-glare function, an anti-fouling function, an antistatic function, a polarizing function and a phase difference function.

11. The display filter of claim 1, wherein the transparent resin layer has a filtering function of filtering at least one region selected from the group consisting of the whole region, near-infrared region and visible light region of electromagnetic waves.

12. The display filter of claim 1, further comprising a dye having an absorption maximum in a wavelength range of 570 nm to 605 nm.

13. A display apparatus comprising the display filter of claim 1.

* * * * *